(12) United States Patent
Morishima

(10) Patent No.: US 6,466,494 B2
(45) Date of Patent: Oct. 15, 2002

(54) SEMICONDUCTOR INTEGRATED CIRCUIT DEVICE WITH MEMORY CIRCUIT

(75) Inventor: Chikayoshi Morishima, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/833,256

(22) Filed: Apr. 12, 2001

(65) Prior Publication Data

US 2002/0027812 A1 Mar. 7, 2002

(30) Foreign Application Priority Data

Sep. 5, 2000 (JP) ........................................ 2000-268632

(51) Int. Cl.[7] ................................................ G11C 8/00
(52) U.S. Cl. ...................................... 365/200; 365/225.7
(58) Field of Search ............................. 365/200, 230.03, 365/230.06, 225.7

(56) References Cited

U.S. PATENT DOCUMENTS 5,293,348 A * 3/1994 Abe .......................... 365/200
5,576,633 A * 11/1996 Roundtree et al. .......... 365/200
5,999,463 A * 12/1999 Park et al. ................... 365/200

FOREIGN PATENT DOCUMENTS

| JP | 07-282596 | 10/1995 | |
| WO | 92/20068 | * 11/1992 | .............. 365/200 |

* cited by examiner

Primary Examiner—Tan T. Nguyen
(74) Attorney, Agent, or Firm—McDermott, Will & Emery

(57) ABSTRACT

A shared program circuit is provided for a plurality of memory circuits, and a select circuit is provided for selecting one of the memory circuits. The select circuit includes gate circuits for transmitting a program signal from the shared program circuit to the memory circuits, and a gate selector that activates one of the gate circuits. Thus, in a semiconductor integrated circuit device provided with a plurality of memory circuits, like an ASIC, chip area occupied by a program circuit for programming an address of a defective memory cell therein is reduced.

8 Claims, 22 Drawing Sheets

SEMICONDUCTOR INTEGRATED CIRCUIT DEVICE WITH MEMORY CIRCUIT

BACKGROUND OF THE INVENTION

1. Field of the Invention

The present invention relates to semiconductor integrated circuit devices provided with memory circuits, and more particularly, to improvement of a redundant circuit of such memory circuit.

2. Description of the Background Art

FIG. 22 is a block diagram showing a configuration of a conventional semiconductor integrated circuit device. Referring to FIG. 22, the semiconductor integrated circuit device 1 is an application specific integrated circuit (ASIC) that includes random access memory (RAM) circuits (hereinafter, each simply referred to as a "memory circuit") M0–M3 and logic circuits L0–L2 mounted irregularly on a single chip (semiconductor substrate) CH. Logic circuit L0 uses memory circuit M0 to process input data for application to logic circuit L1. Logic circuit L1 uses memory circuits M1 and M2 to process data supplied from logic circuit L0 for application to logic circuit L2. Logic circuit L2 uses memory circuit M3 to process data supplied from logic circuit L1 for output.

Semiconductor integrated circuit device 1 further includes program circuits P0–P3 provided corresponding to memory circuits M0–M3. FIG. 23 is a block diagram showing only memory circuits M0–M3 and program circuits P0–P3 extracted from FIG. 22.

Each of memory circuits M0–M3 includes a redundant memory cell as well as a regular memory cell. When the regular memory cell is not defective, the regular memory cell is selected in response to an address signal A0–A3 applied. Conversely, if the regular memory cell is defective, an address for specification of the memory cell is programmed in program circuit P0–P3. In such a case, when the applied address signal A0–A3 matches the programmed address, the redundant memory cell is selected instead of the regular memory cell.

In the case of the semiconductor integrated circuit device 1 being ASIC as described above, it is often the case that memory circuits M0–M3 are different in size from one another. In a large memory circuit, there is a high possibility that its memory cell suffers a defect. On the other hand, such possibility is low in a small memory circuit. Nevertheless, conventional semiconductor integrated circuit device 1 is generally provided with program circuits P0–P3 corresponding to memory circuits M0–M3, of which some program circuits would never be utilized. Since program circuits P0–P3 are configured by fuses fusable by laser, miniaturization of the program circuits is more difficult than that of the memory circuits and logic circuits which are formed of transistors. Accordingly, the presence of such unused program circuits leads to degradation in efficiency of chip area.

Japanese Patent Laying-Open No. 7-282596 discloses a technique to provide a single memory circuit having a memory cell array divided into a plurality of blocks, with a program circuit that can be shared by rows and columns on the block basis. This reference, however, does not describe any technique applicable to a semiconductor integrated circuit device having a plurality of memory circuits like an ASIC.

SUMMARY OF THE INVENTION

An object of the present invention is to provide a semiconductor integrated circuit device with reduced chip area being occupied by a program circuit.

The semiconductor integrated circuit device according to the present invention includes a plurality of memory circuits, a select circuit, and a shared program circuit. The plurality of memory circuits receive address signals different from each other. Each memory circuit includes a regular memory cell and a redundant memory cell. The select circuit selects at least one of the plurality of memory circuits. The shared program circuit is provided for the plurality of memory circuits. In the shared program circuit, it is possible to program an address of the regular memory cell that should be replaced by the redundant memory cell in the memory circuit selected by the select circuit.

Preferably, the select circuit includes a plurality of transmission circuits and an activation circuit. The plurality of transmission circuits respectively transmit a program signal representing the address programmed in the shared program circuit to the plurality of memory circuits. The activation circuit selectively activates the plurality of transmission circuits. Still preferably, the plurality of transmission circuits are provided corresponding to the plurality of memory circuits.

In this semiconductor integrated circuit device, the shared program circuit is provided for the plurality of memory circuits. Accordingly, chip area occupied by such shared program circuit is reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
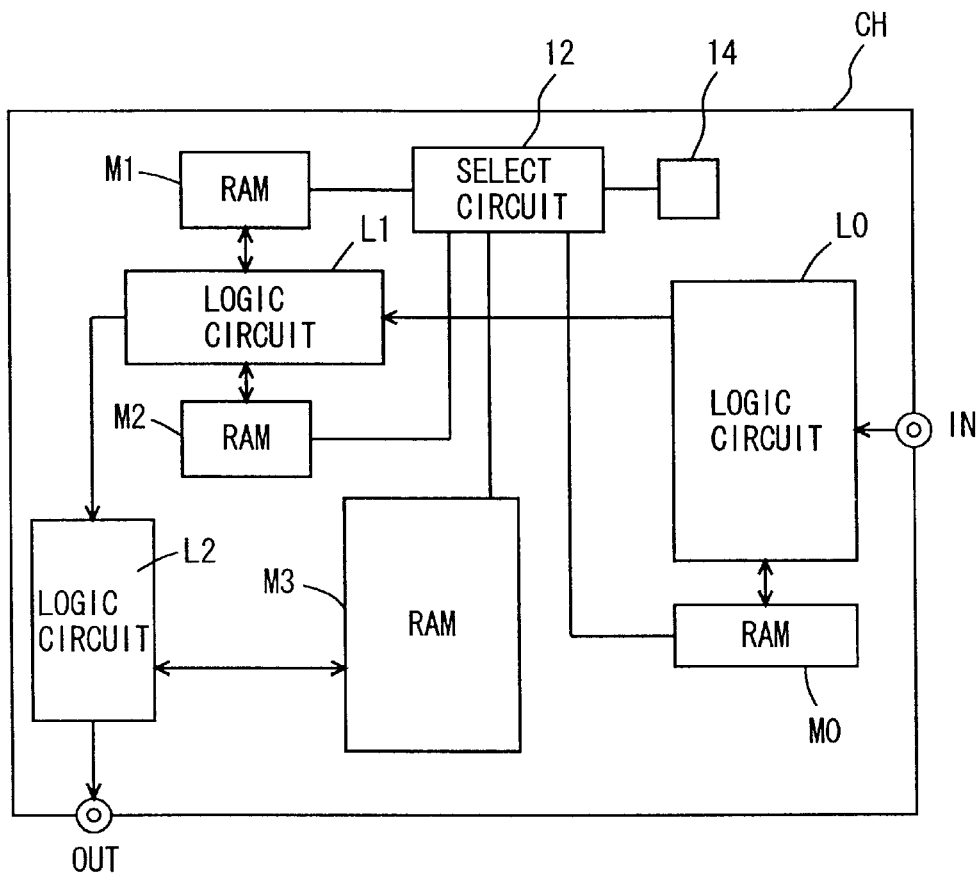
FIG. 1 is a block diagram showing an entire configuration of the semiconductor integrated circuit device according to a first embodiment of the present invention.

Hereinafter, embodiments of the present invention will be described in detail with reference to the drawings, in which same or corresponding portions are denoted by same reference characters and detailed description thereof will not be repeated.

First Embodiment

Referring to FIG. 1, the semiconductor integrated circuit device 10 according to the first embodiment is an ASIC, which includes memory circuits M0–M3, logic circuits L0–L2, a select circuit 12, and a shared program circuit 14. Memory circuits M0–M3, logic circuits L0–L2, select circuit 12 and shared program circuit 14 are formed on a single chip (semiconductor substrate) CH.

Logic circuit L0 uses memory circuit M0 to process input data to supply to logic circuit L1. Logic circuit L1 uses memory circuits M1 and M2 to process data supplied from logic circuit L0, and supplies the resultant data to logic circuit L2. Logic circuit L2 uses memory circuit M3 to process data supplied from logic circuit L1, and outputs the resultant data.

Memory circuits M0–M3 each include a plurality of regular memory cells and redundant memory cells arranged in rows and columns, as will be described in detail below. The following is exemplary configurations of memory circuits M0–M3, expressed by (the number of regular rows+the number of redundant rows)×(the number of regular columns+the number of redundant columns).

M0: (32+1)×(8+1)
M1: (4+1)×(16+1)
M2: (4+1)×(4+1)
M3: 4×(8+1)

Specifically, memory circuit M0 includes 32 regular rows, one redundant row, eight regular columns and one redundant column. Memory circuit M1 includes four regular rows, one redundant row, 16 regular columns and one redundant column. Memory circuit M2 includes four regular rows, one redundant row, four regular columns and one redundant column. Memory circuit M3 includes four regular rows, eight regular columns and one redundant column. Memory circuit M3 does not include any redundant rows.

Figure 22:
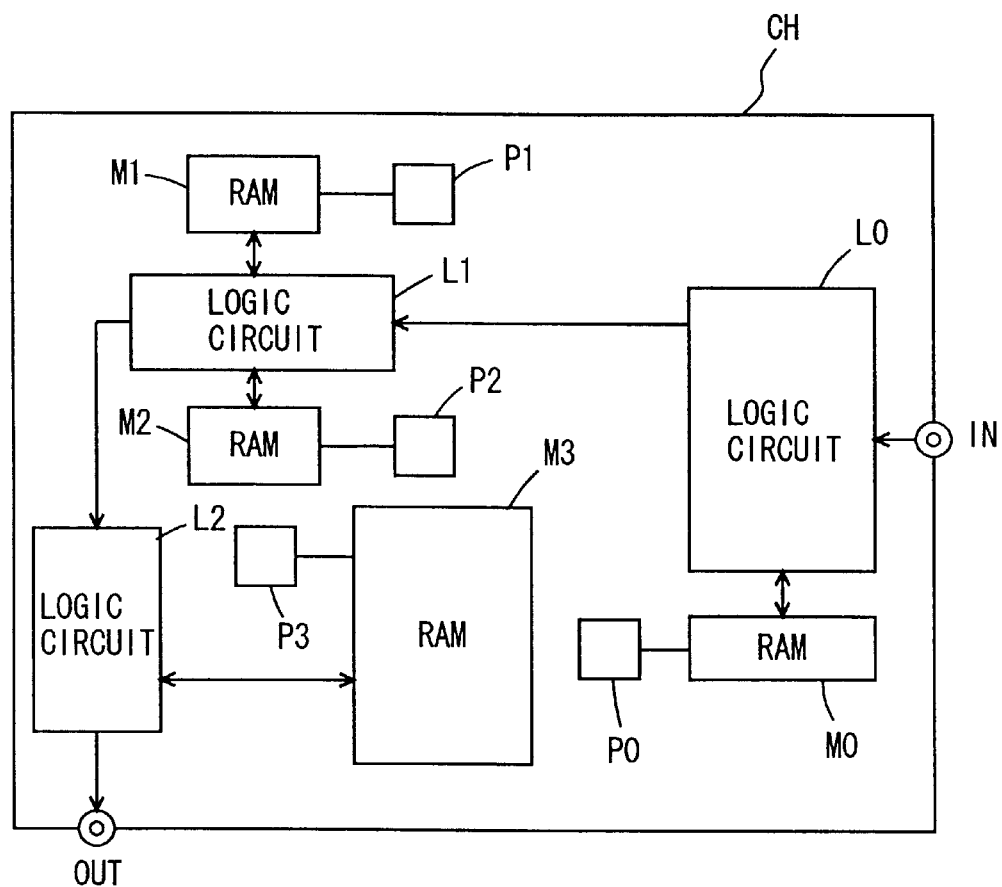
FIG. 22 is a block diagram showing an entire configuration of a conventional semiconductor integrated circuit device.
Figure 23:
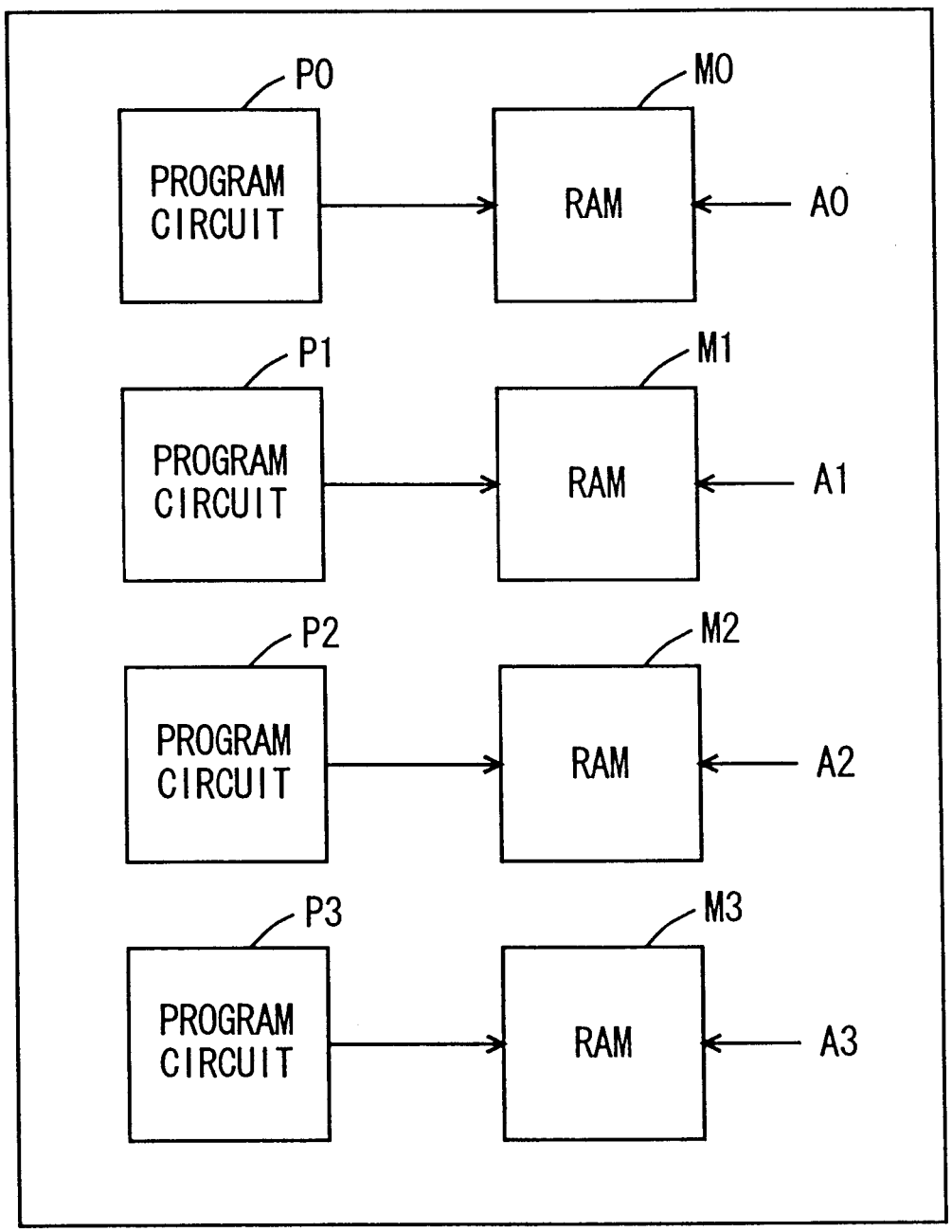
FIG. 23 is a block diagram showing a configuration of a primary portion of the semiconductor integrated circuit device shown in FIG. 22.

In the first embodiment, select circuit 12 and shared program circuit 14 are provided instead of program circuits P1–P3 shown in FIG. 22. Select circuit 12 selects one of the plurality of memory circuits M0–M3. Shared program circuit 14 is provided for the plurality of memory circuits M0–M3. It is possible to program, in this shared program circuit 14, an address of a regular memory cell that should be replaced by a redundant memory cell in memory circuit M0–M3 selected by select circuit 12.

Figure 2:
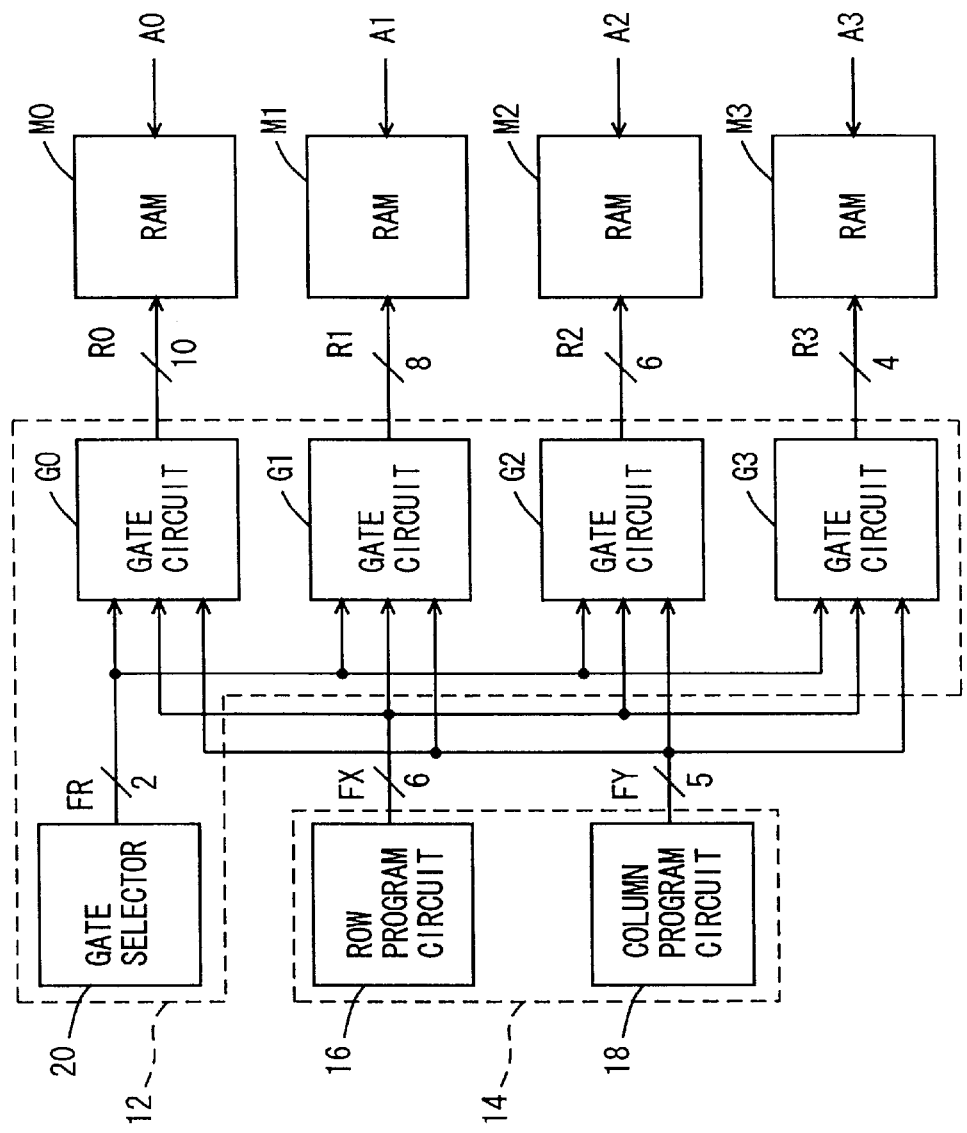
FIG. 2 is a block diagram showing a configuration of a primary portion of the semiconductor integrated circuit device shown in FIG. 1.

FIG. 2 only shows memory circuits M0–M3, select circuit 12 and shared program circuit 14 extracted from FIG. 1. Referring to FIG. 2, memory circuit M0 is provided with address signal A0 from logic circuit L0. Memory circuit M1 is provided with address signal A1 from logic circuit L1. Memory circuit M2 is provided with address signal A2 from logic circuit L1. Memory circuit M3 is provided with address signal A3 from logic circuit L2. Memory circuits M0–M3 respond to address signals A0–A3 different from one another, to perform data reading and writing. If there are no defects in regular memory cells, the regular memory cells are selected in response to address signals A0–A3 applied.

Shared program circuit 14 includes a row program circuit 16 and a column program circuit 18. In row program circuit 16, it is possible to program a row address of a regular memory cell that should be replaced by a redundant memory cell arranged in the row in memory circuit M0–M3. In column program circuit 18, it is possible to program a column address of a regular memory cell that should be replaced by a redundant memory cell arranged in the column in memory circuit M0–M3. Thus, if there is a defect in the regular memory cell arranged in a row of memory circuit M0–M3, row program circuit 16 outputs a row program signal FX indicating the row address thus programmed. If there is a defect in the regular memory cell arranged in a column of memory circuit M0–M3, column program circuit 18 outputs a column program signal FY indicating the column address thus programmed.

Select circuit 12 includes gate circuits G0–G3 and a gate selector 20. Gate circuits G0–G3 are provided corresponding to memory circuits M0–M3. Gate selector 20 selects and activates one of gate circuits G0–G3. The activated gate circuit G0–G3 transmits row program signal FX and column program signal FY to the relevant memory circuit M0–M3 as a program signal R0–R3.

Figure 3:
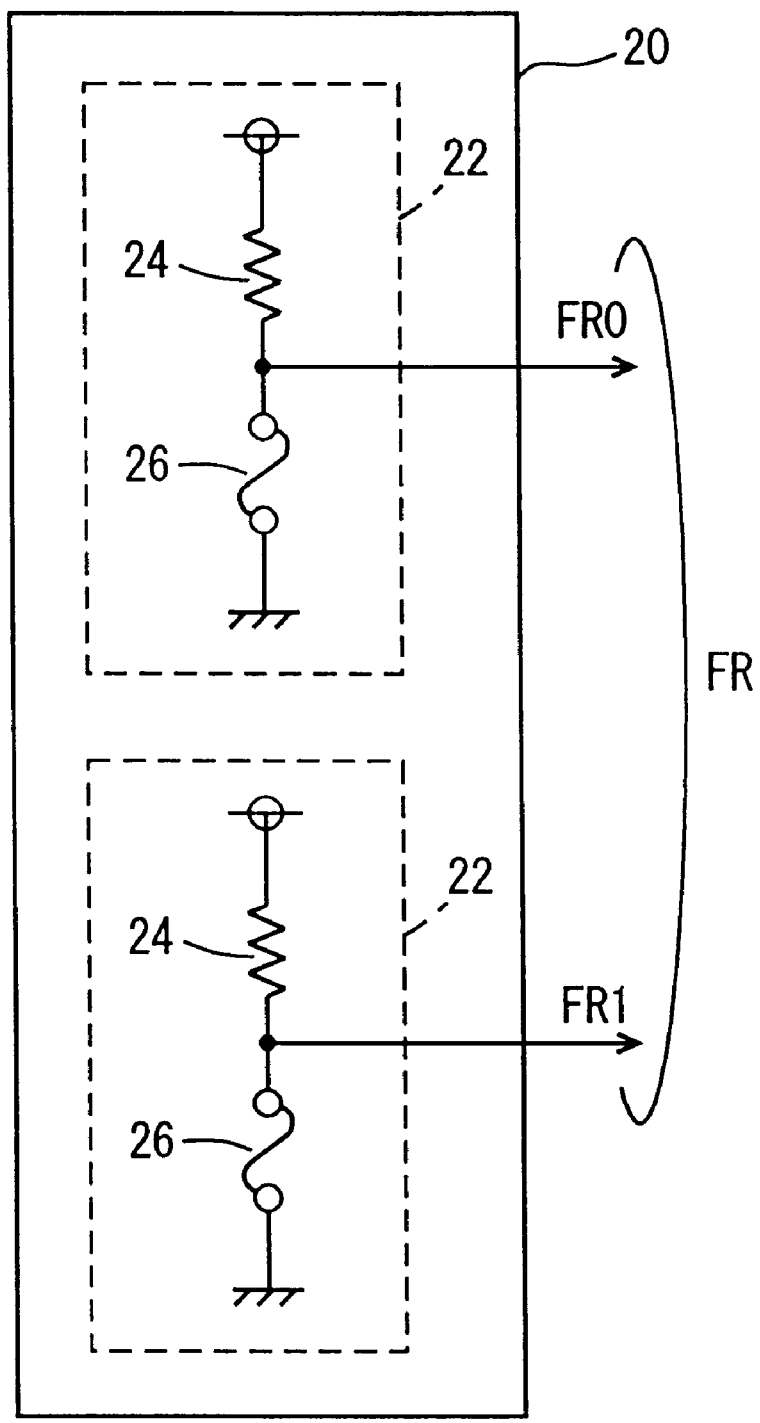
FIG. 3 is a circuit diagram showing a configuration of a gate selector shown in FIG. 2.

FIG. 3 shows a configuration of the gate selector 20 shown in FIG. 2. Referring to FIG. 3, gate selector 20 includes two fuse circuits 22. Each fuse circuit 22 includes a pull-up resistance 24 and a fuse 26 that is connected in series with pull-up resistance 24. When fuse 26 is blown, a gate select signal FR0 or FR1 of an H (logical high) level is output. When fuse 26 is not blown, gate select signal FR0 or FR1 of an L (logical low) level is output. Thus, gate selector 20 supplies a gate select signal FR of 2 bits (FR0, FR1) to gate circuits G0–G3.

Figure 4:
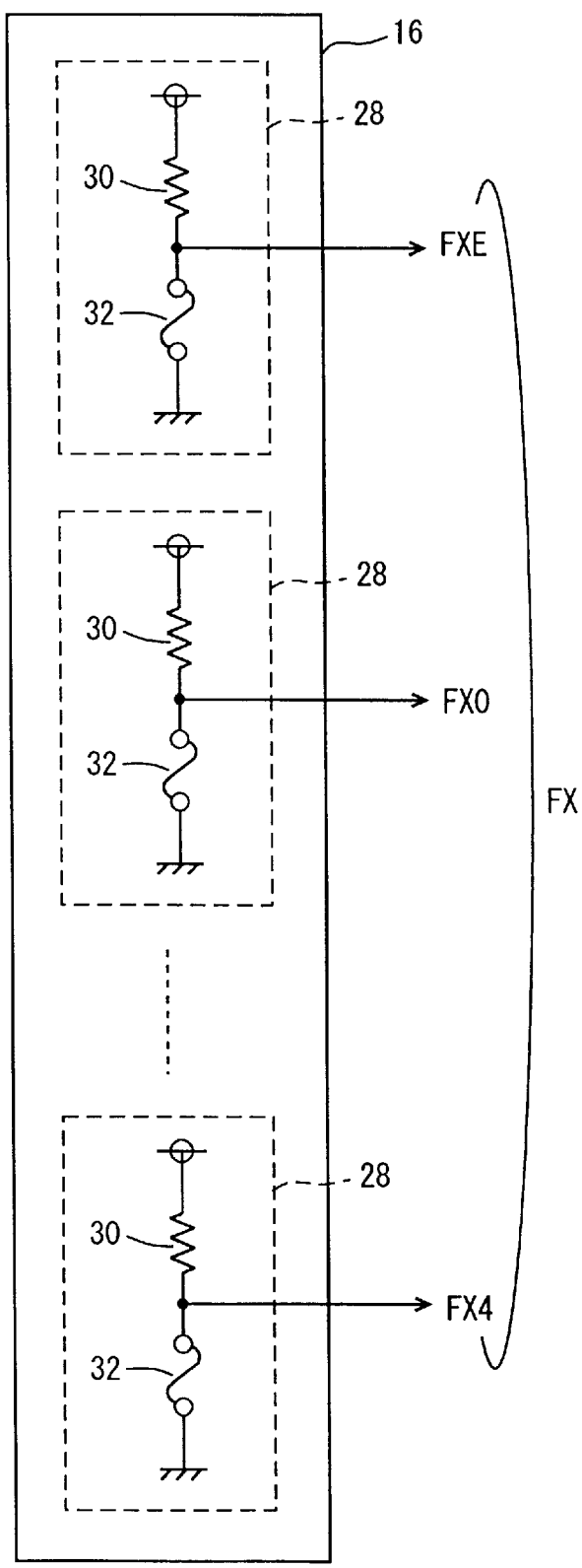
FIG. 4 is a circuit diagram showing a configuration of a row program circuit shown in FIG. 2.

FIG. 4 shows a configuration of the row program circuit 16 shown in FIG. 2. Referring to FIG. 4, row program circuit 16 includes six fuse circuits 28. Each fuse circuit 28 includes a pull-up resistance 30 and a fuse 32 that is connected in series with pull-up resistance 30. When fuse 32 is blown, a row program signal FXE, FX0, FX1, FX2, FX3 or FX4 of an H level is output. If fuse 32 is not blown, row program signal FXE, FX0, FX1, FX2, FX3 or FX4 of an L level is output. Thus, row program circuit 16 supplies a row program signal FX of 6 bits (FXE, FX0–FX4) to gate circuits G0–G3.

Figure 5:
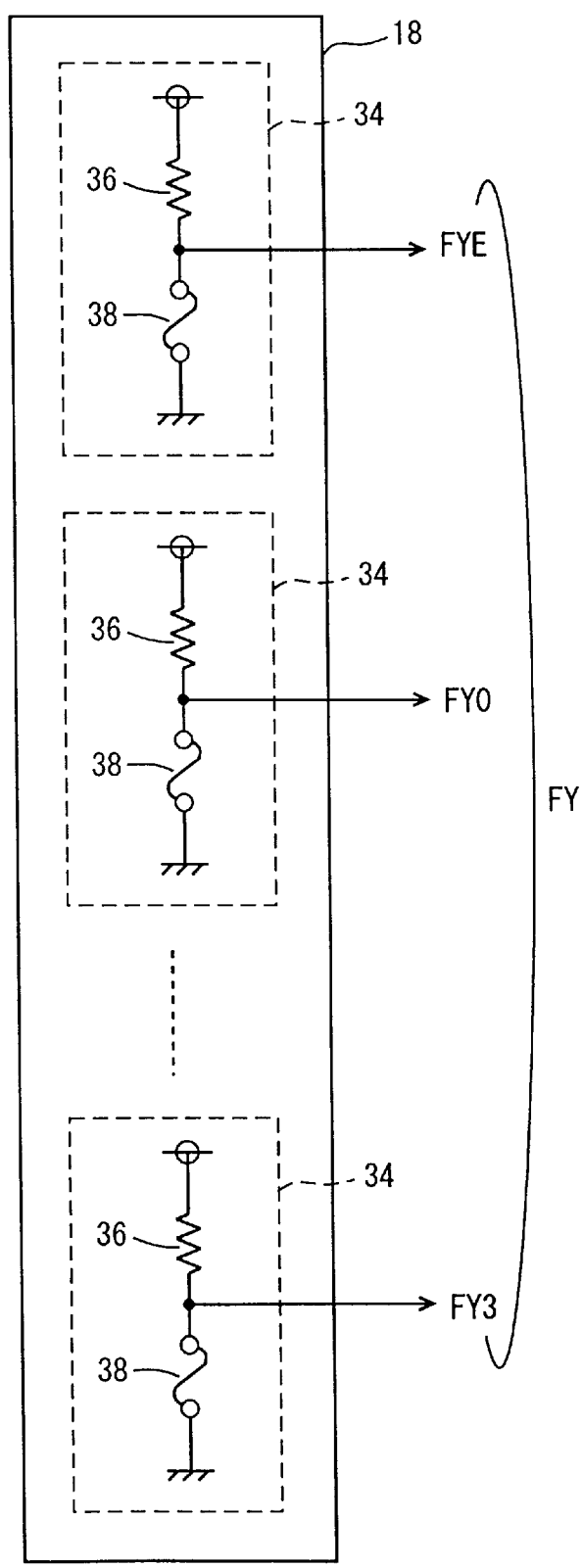
FIG. 5 is a circuit diagram showing a configuration of a column program circuit shown in FIG. 2.

FIG. 5 shows a configuration of the column program circuit 18 shown in FIG. 2. Referring to FIG. 5, column program circuit 18 includes five fuse circuits 34. Each fuse circuit 34 includes a pull-up resistance 36, and a fuse 38 connected in series with pull-up resistance 36. If fuse 38 is blown, a column program signal FYE, FY0–FY3 of an H level is output. If fuse 38 is not blown, column program signal FYE, FY0–FY3 of an L level is output. Thus, column program circuit 18 supplies a column program signals FY of 5 bits (FYE, FY0–FY3) to gate circuits G0–G3.

Figure 6:
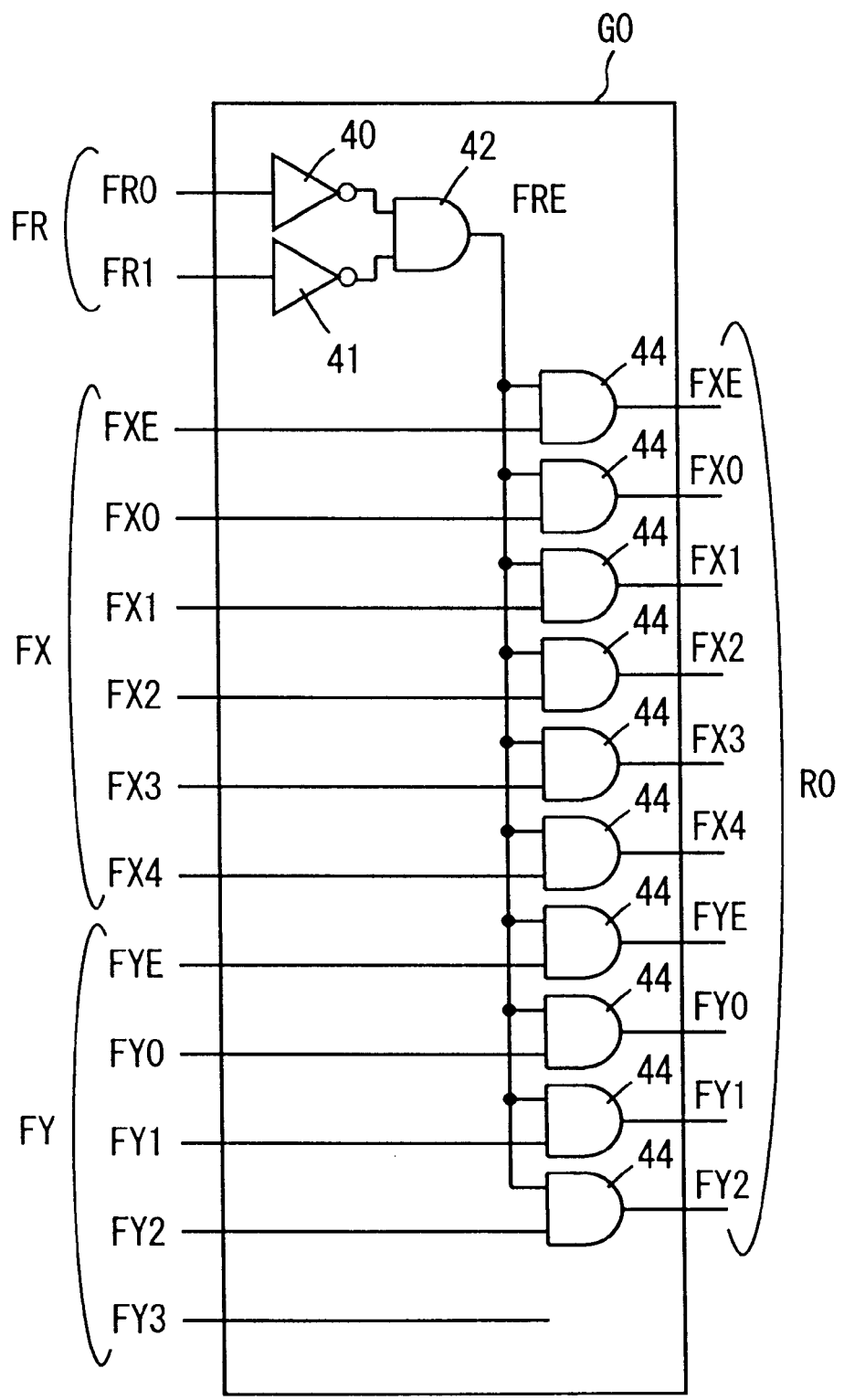
FIGS. 6–9 are circuit diagrams showing configurations of respective gate circuits G0–G3 shown in FIG. 2.

FIG. 6 shows a configuration of the gate circuit G0 shown in FIG. 2. Referring to FIG. 6, gate circuit G0 includes inverter circuits 40 and 41, an AND circuit 42, and ten AND circuits 44. When gate select signals FR0 and FR1 are both at an L level, AND circuit 42 feeds AND circuits 44 with a gate enable signal FRE of an H level. Thus, the ten AND circuits 44 transmit, respectively, program signals FXE, FX0, FX1, FX2, FX3, FX4, FYE, FY0, FY1, and FY2. More specifically, gate circuit G0 provides memory circuit M0 with a program signal R0 of 10 bits (FXE, FX0–FX4, FYE, FY0–FY2) out of the received program signals of 11 bits FX (FXE, FX0–FX4), FY FYE, FY0–FY3).

Conversely, if either gate select signal FR0 or gate select signal FR1 is at an H level, AND circuit 42 feeds AND circuits 44 with gate enable signal FRE of an L level. Thus, the ten AND circuits 44 respectively output program signals FXE, FX0–FX4, FYE, FY0–FY2 all of an L level.

Figure 7:
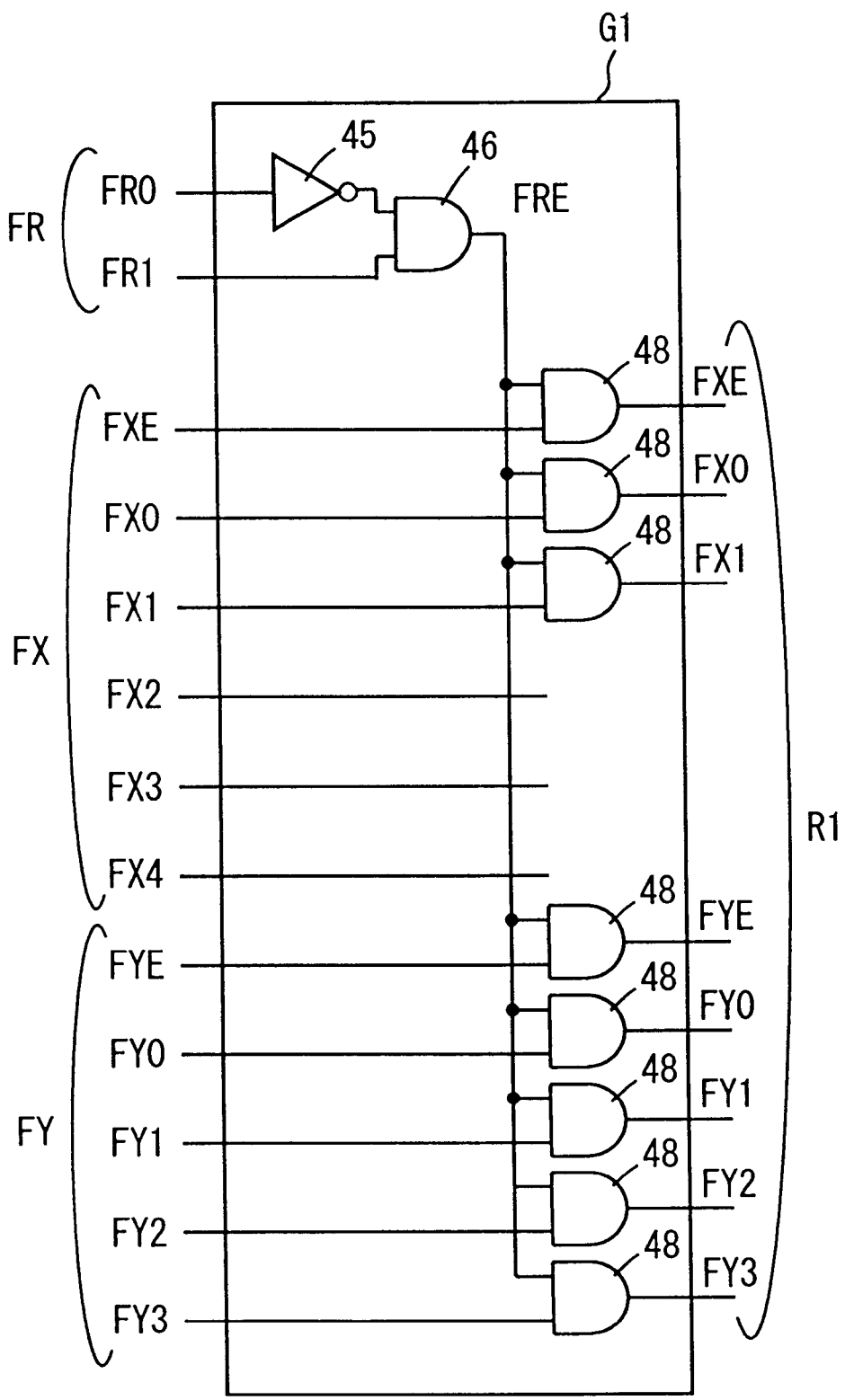

FIG. 7 shows a configuration of the gate circuit G1 shown in FIG. 2. Referring to FIG. 7, gate circuit G1 includes an inverter circuit 45, an AND circuit 46, and eight AND circuits 48.

When gate select signal FR0 is at an L level and gate select signal FR1 is at an H level, AND circuit 46 feeds eight AND circuits 48 with a gate enable signal FRE of an H level. Thus, the eight AND circuits 48 transmit, respectively, program signals FXE, FX0, FX1, FYE, FY0, FY1, FY2, and FY3. More specifically, gate circuit G1 provides memory circuit M1 with a program signal R1 of 8 bits (FXE, FX0, FX1, FYE, FY0–FY3) out of the received program signals of 11 bits FX (FXE, FX0–FX4), FY (FYE, FY0–FY3).

Conversely, if gate select signal FR0 is at an H level or if gate select signal FR1 is at an L level, then AND circuit 46 supplies gate enable signal FRE of an L level to the eight AND circuits 48. Thus, the eight AND circuits 48 respectively output program signals FXE, FX0, FX1, FYE, FY0–FY3 all of an L level.

Figure 8:
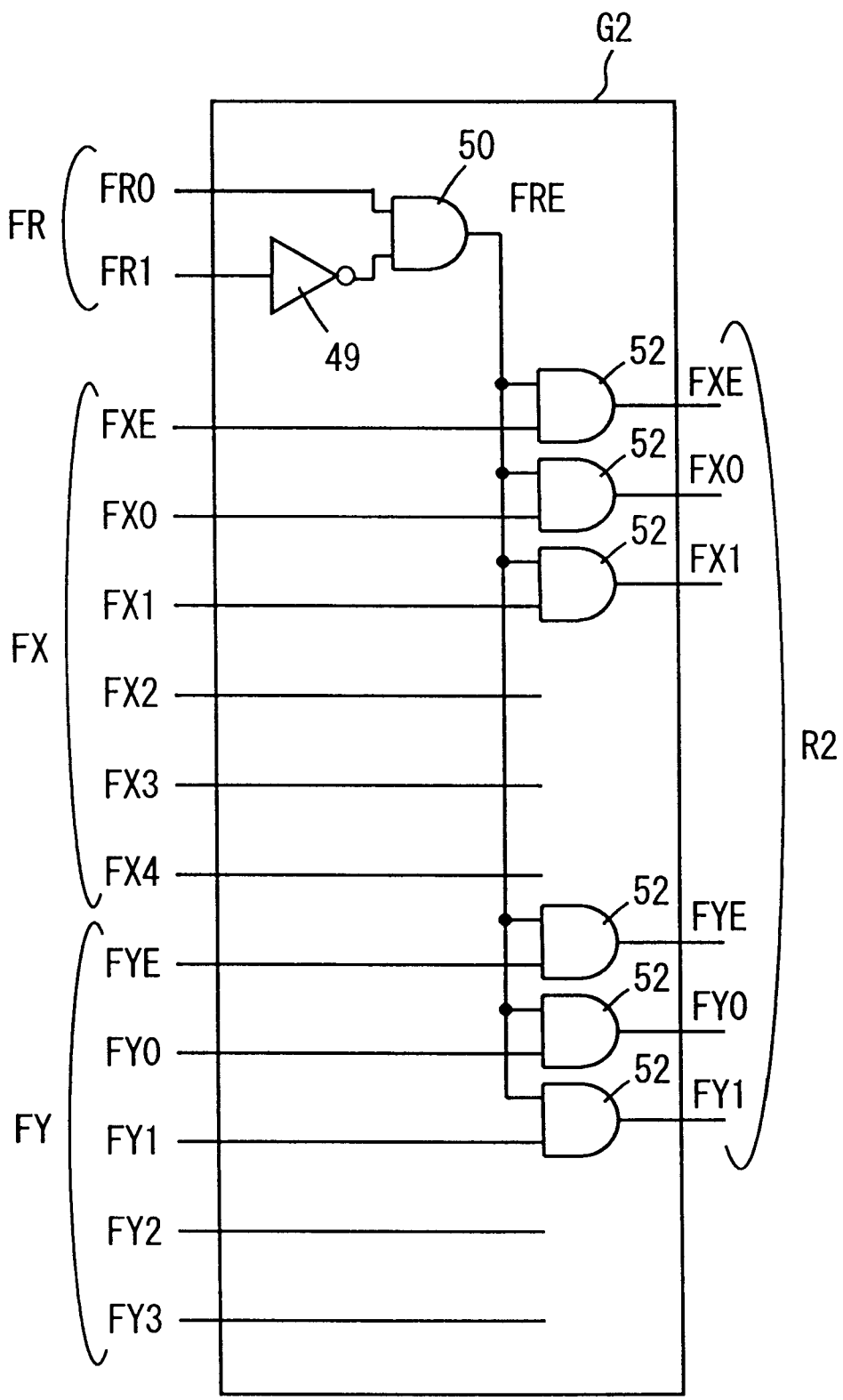

FIG. 8 shows a configuration of the gate circuit G2 shown in FIG. 2. Referring to FIG. 8, gate circuit G2 includes an inverter circuit 49, an AND circuit 50, and six AND circuits 52.

If gate select signal FR0 is at an H level and gate select signal R1 is at an L level, AND circuit 50 supplies gate enable signal FRE of an H level to the six AND circuits 52. Thus, the six AND circuits 52 transmit, respectively, program signals FXE, FX0, FX1, FYE, FY0 and FY1. More specifically, gate circuit G2 provides memory circuit M2 with a program signal R2 of 6 bits (FXE, FX0, FX1, FYE, FY0, FY1) out of the received program signals of 11 bits FX (FXE, FX0–FX4), FY (FYE, FY0–FY3).

Conversely, if gate select signal FR0 is at an L level or if gate select signal FR1 is at an H level, then AND circuit 50 supplies gate enable signal FRE of an L level to the six AND circuits 52. Thus, the six AND circuits 52 respectively output program signals FXE, FX0, FX1, FYE, FY0 and FY1 all of an L level.

Figure 9:
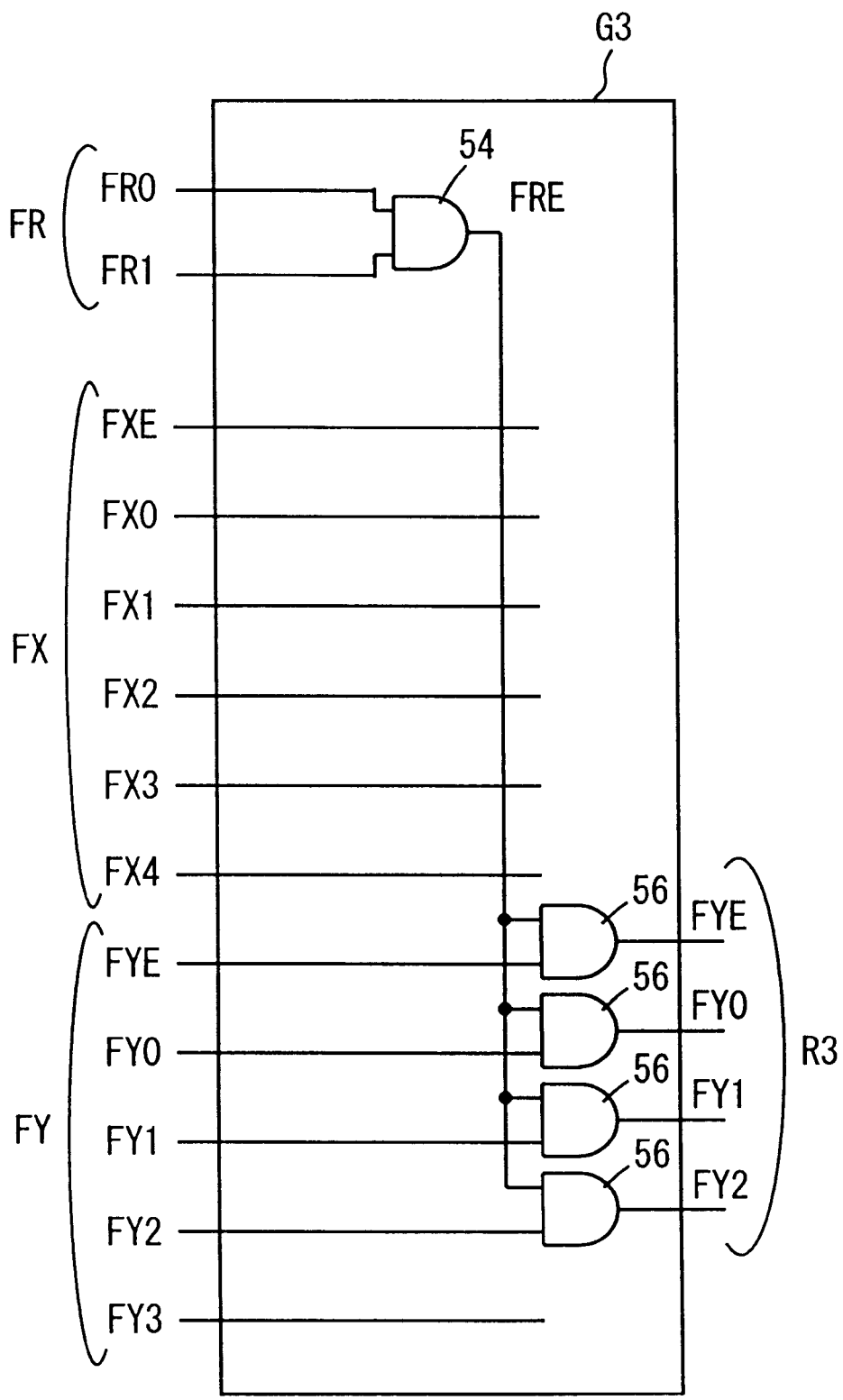

FIG. 9 shows a configuration of the gate circuit G3 shown in FIG. 2. Referring to FIG. 9, gate circuit G3 includes an AND circuit 54 and four AND circuits 56. When gate select signals FR0 and FR1 are both at an H level, AND circuit 54 supplies gate enable signal FRE of an H level to four AND circuits 56. Thus, the four AND circuits 56 respectively transmit program signals FYE, FY0, FY1 and FY2. More specifically, gate circuit G3 transmits to memory circuit M3, a program signal R3 of 4 bits (FYE, FY0–Y2) out of the received program signals of 11 bits FX (FXE, FX0–FX4), FY (FYE, FY0–FY3).

Conversely, if either gate select signal FR0 or gate select signal FR1 is at an L level, AND circuit 54 supplies gate enable signal FRE of an L level to four AND circuits 56. Thus, the four AND circuits 56 respectively output program signals FYE, FY0, FY1 and FY2 all of an L level.

Figure 10:
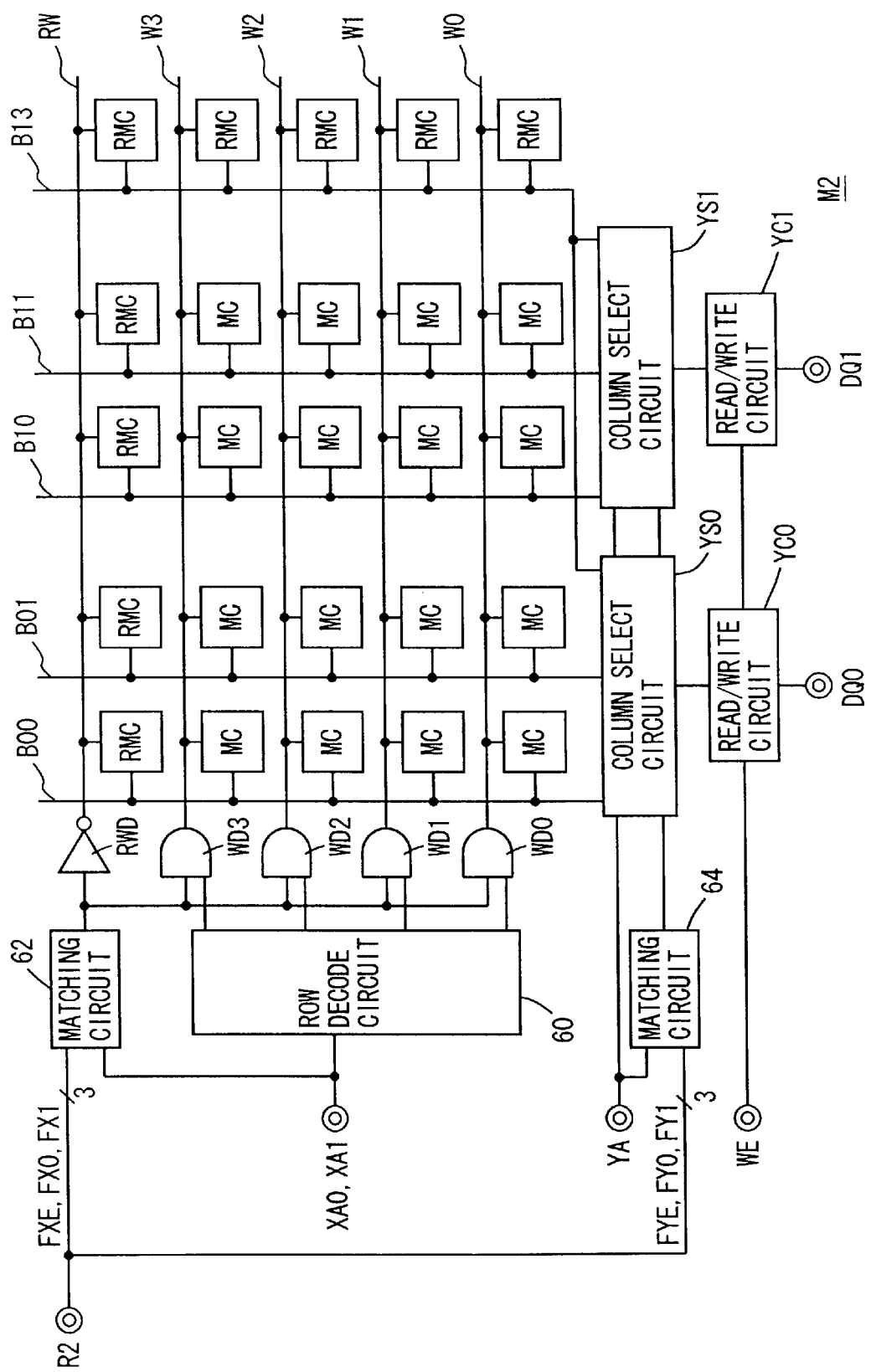
FIG. 10 is a block diagram showing a configuration of a memory circuit M2 shown in FIG. 2.

FIG. 10 shows a configuration of each memory circuit in FIGS. 1 and 2. Hereinafter, memory circuit M2 having a configuration of (4+1)×(4+1) will be described representatively.

Referring to FIG. 10, memory circuit M2 includes 16 (=4×4) regular memory cells MC arranged in rows and columns, four word lines W0–W3 arranged along the rows and four bit lines B00, B01, B10, B11 arranged along the columns. Word lines W0–W3 are each connected to four memory cells MC arranged in a respective row. Bit lines B00, B01, B10, B11 are each connected to four memory cells MC arranged in a respective column.

Memory circuit M2 is provided with one redundant row and one redundant column, where redundant memory cells RMC are arranged. A redundant word line RW is arranged along the redundant row, and connected to five redundant memory cells RMC in the redundant row. A redundant bit line RB is arranged along the redundant column, and connected to five redundant memory cells RMC in the redundant column.

Memory circuit M2 further includes: AND circuits WD0–WD3 for driving word lines W0–W3, respectively; an inverter circuit RWD for driving redundant word line RW; a row decode circuit 60 that decodes row address signals XA0, XA1 to select one of AND circuits WD0–WD3; a matching circuit 62 that compares row address signals XA0, XA1 with program signal R2 (FXE, FX0, FX1) to detect their matching; column select circuits YS0, YS1 responsive to a column address signal YA for selecting bit lines B00, B01, B10, B11; read/write circuits YC0, YC1 responsive to a write enable signal WE for performing reading and writing of data signals DQ0, DQ1; and a matching circuit 64 that compares column address signal YA with program signal R2 (FYE, FY0, FY1) to detect their matching.

Figure 11:
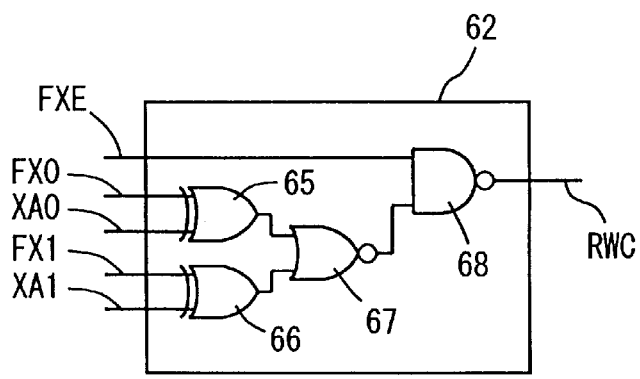
FIG. 11 is a circuit diagram showing a configuration of a matching circuit 62 shown in FIG. 10.

FIG. 11 shows a configuration of the matching circuit 62 shown in FIG. 10. Referring to FIG. 11, matching circuit 62 includes XOR circuits 65 and 66, a NOR circuit 67, and a NAND circuit 68.

When redundant memory cells RMC arranged in the row are not to be used, row program signal FXE of an L level is applied. In this case, matching circuit 62 supplies a signal RWC of an H level to AND circuits WD0–WD3 and inverter circuit RWD, regardless of row address signals XA0, XA1 and column program signals FX0, FX1 being applied. Thus, AND circuits WD0–WD3 transmit the output of row decode circuit 60 as it is to word lines W0–W3, and inverter circuit RWD drives redundant word line RW to an L level.

Conversely, if redundant memory cells RMC arranged in the row are to be used, row program signal FXE of an H level is applied. If row address signal XA0 matches row program signal FX0 and row address signal XA1 matches row program signal FX1, then matching circuit 62 supplies signal RWC of an L level to AND circuits WD0–WD3 and inverter circuit RWD. Thus, regardless of the output signal of row decode circuit 60, AND circuits WD0–WD3 drive word lines W0–W3 to an L level, and inverter circuit RWD drives redundant word line RW to an H level.

Figure 12:
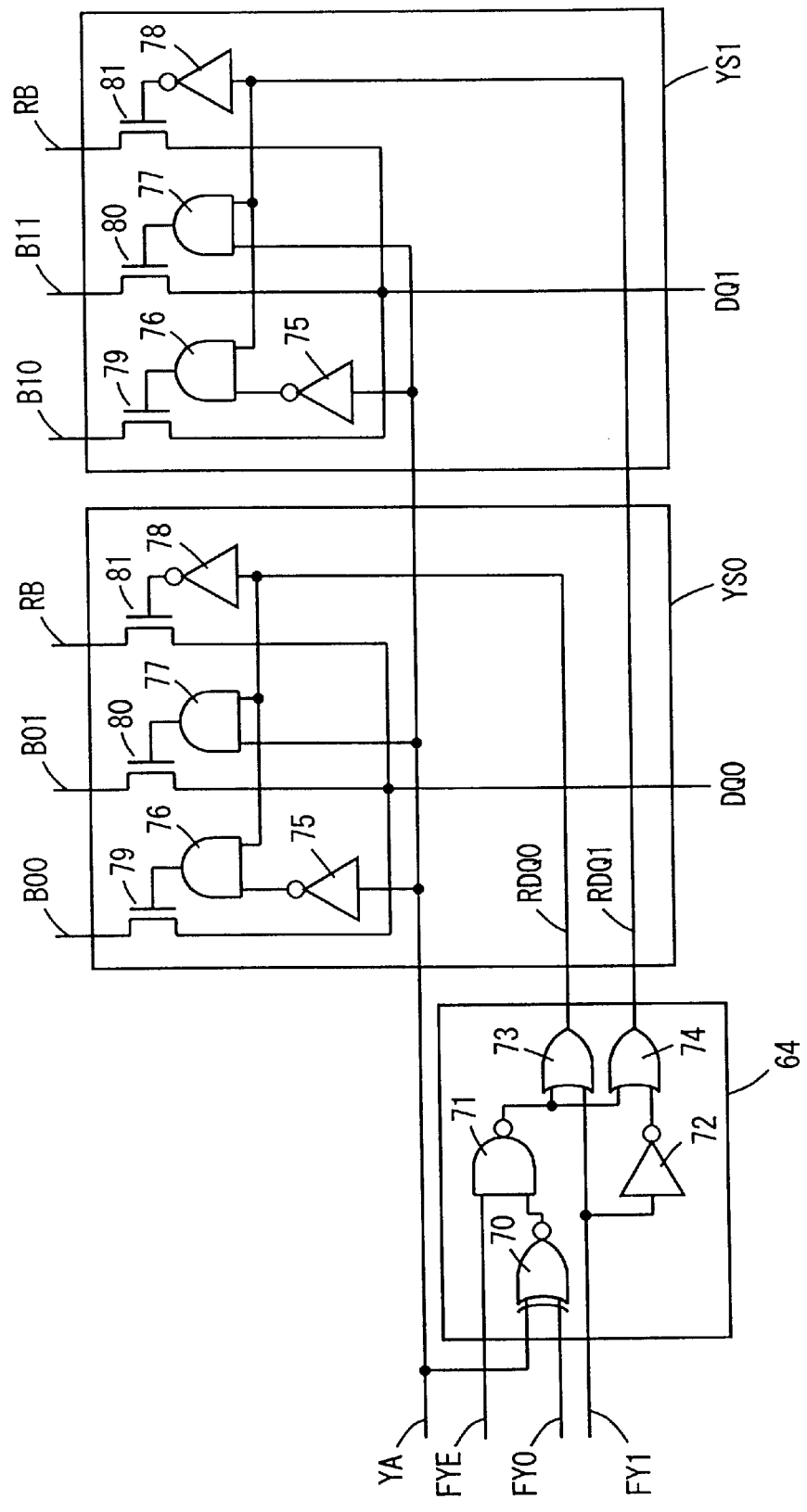
FIG. 12 is a circuit diagram showing configurations of a matching circuit 64 and column select circuits YS0, YS1 shown in FIG. 10.

FIG. 12 shows configurations of column select circuits YS0, YS1 and matching circuit 64 shown in FIG. 10. Referring to FIG. 12, column select circuits YS0, YS1 each include an inverter circuit 75, AND circuits 76 and 77, an inverter circuit 78, and N channel MOS transistors 79–81. Matching circuit 64 includes an XNOR circuit 70, a NAND circuit 71, an inverter circuit 72, and OR circuits 73 and 74.

When redundant memory cells RMC arranged in the column are not to be used, column program signal FYE of an L level is applied. Thus, matching circuit 64 supplies a signal RDQ0 of an H level to column select circuit YS0, and a signal RDQ1 of an H level to column select circuit YS1.

Accordingly, in column select circuit YS0, an inverted signal of column address signal YA is applied to a gate of transistor 79, and column address signal YA, as it is, is applied to a gate of transistor 80. Thus, transistor 79 or 80 turns on, and data signal DQ0 is read out from bit line B00 or B01 to read/write circuit YC0, or, data signal DQ0 is written into bit line B00 or B01 from read/write circuit YC0. At this time, transistor 81 is at an off state, so that redundant bit line RB is not selected. Further, in column select circuit YS1, the inverted signal of column address signal YA is applied to the gate of transistor 79, and column address signal YA, as it is, is applied to the gate of transistor 80. Thus, transistor 79 or 80 turns on, and data signal DQ1 is read out from bit line B10 or B11 to read/write circuit YC1 or data signal DQ1 is written into bit line B10 or B11 from read/write circuit YC1. At this time, as transistor 81 is at an off state, redundant bit line RB is not selected.

Conversely, when redundant memory cells RMC in the column are to be utilized, column program signal FYE of an H level is applied. For example, when column program signals FY0 and FY1 are both at an L level and column address signal YA is at an L level, then signal RDQ0 attains an L level and signal RDQ1 attains an H level. Thus, in column select circuit YS0, transistors 79 and 80 turn off, and transistor 81 turns on. Accordingly, bit lines B00 and B01 are not selected and, instead, redundant bit line RB is selected. Further, in column select circuit YS1, transistor 79 turns on and transistors 80 and 81 turn off. Thus, bit line B10 is selected and redundant bit line RB is not selected.

Other memory circuits M0, M1 and M3 each have a configuration identical to that of memory circuit M2 as described above. Specifically, memory circuit M0 of a configuration of (32+1)×(8+1) includes regular memory cells arranged in 32 rows and eight columns, and redundant memory cells arranged in one row and one column. This memory circuit M0 is provided with program signal R0 of 10 (=5+1+3+1) bits. Memory circuit M1 having a configuration of (4+1)×(16+1) includes regular memory cells arranged in four rows and 16 columns and redundant memory cells arranged in one row and one column. The memory circuit M1 is provided with program signal R1 of 8 (=2+1+4+1) bits. Memory circuit M3 having a configuration of 4×(8+1) includes regular memory cells in four rows and eight columns and redundant memory cells in one column. The memory circuit M3 is provided with program signal R3 of 4 (=3+1) bits.

An operation of semiconductor integrated circuit device 10 having the configuration as describe above will now be explained.

In the case where there is a defect in a regular row in memory circuit M2, for example, an address for specifying the regular row is programmed in row program circuit 16. More specifically, fuse 32 in row program circuit 16 is selectively blown. Further, fuse 26 in gate selector 20 is blown such that gate circuit G2 is selected. More specifically, fuse 26 within fuse circuit 22 for output of gate select signal FR0 is blown; whereas fuse 26 within fuse circuit 22 for output of gate select signal FR1 is left unblown.

In this case, gate select signal FR0 attains an H level and gate select signal FR1 attains an L level, so that gate circuit G2 is activated while other gate circuits G0, G1 and G3 are not activated. Accordingly, of the program signal of 11 bits FX (FXE, FX0–FX4), FY (FYE, FY0–FY3) output from shared program circuit 14, program signal R2 of 6 bits (FXE, FX0, FX1, FYE, FY0, FY1) is transmitted to memory circuit M2. Thus, in memory circuit M2, the redundant row is selected instead of the regular row containing the defect.

Similarly, if there is a defect in a regular column in memory circuit M2, an address specifying the regular column is programmed in column program circuit 18. When the column address is programmed in column program circuit 18, the redundant column is selected instead of the regular column having the defect.

As explained above, according to the first embodiment, shared program circuit 14 is provided for a plurality of memory circuits M0–M3, and select circuit 12 is provided for selecting one of memory circuits M0–M3. Thus, it becomes possible to considerably reduce chip area occupied by shared program circuit 14.

Second Embodiment

Figure 13:
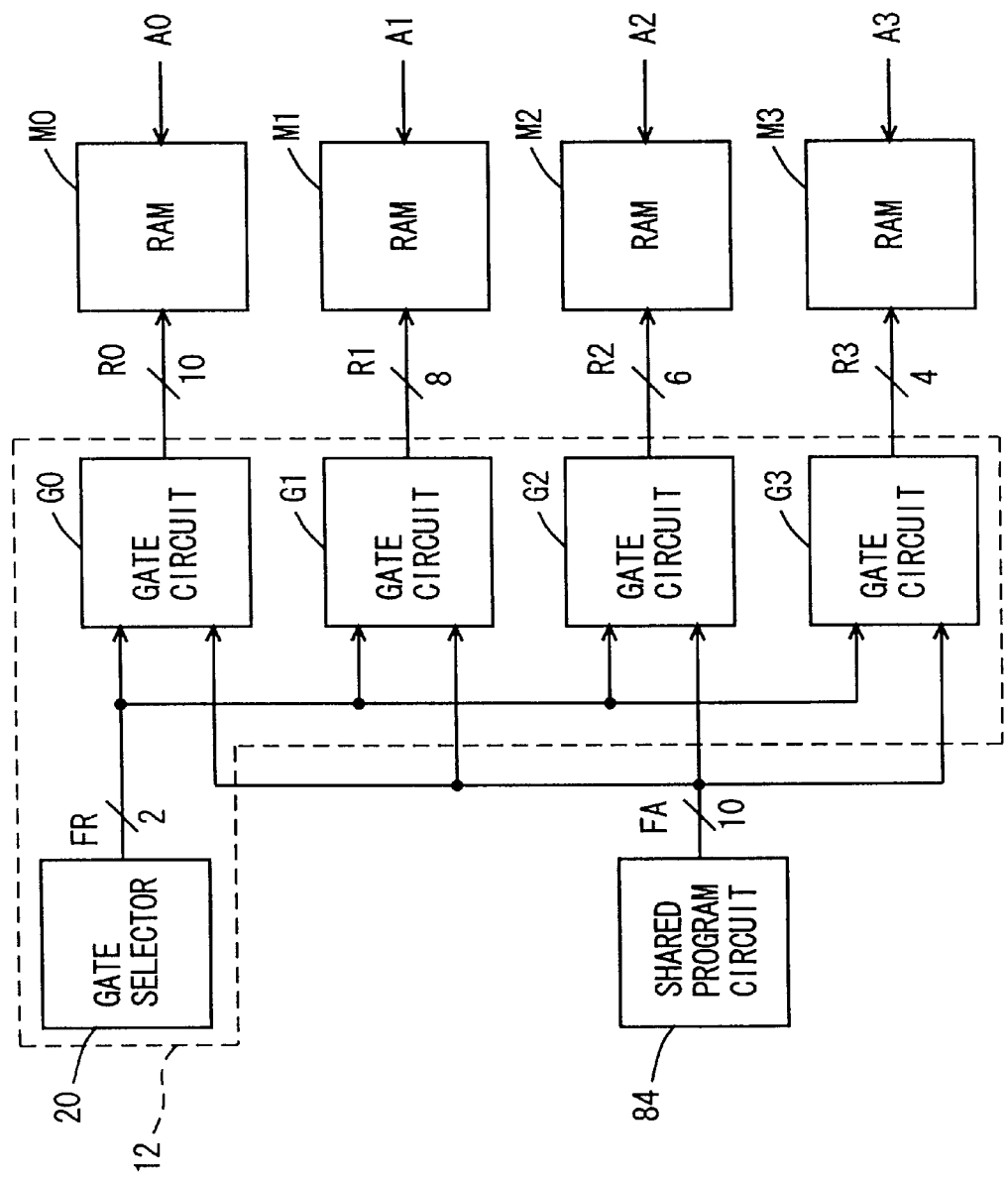
FIG. 13 is a block diagram showing a configuration of a primary portion of the semiconductor integrated circuit device according to a second embodiment of the present invention.

In the second embodiment, as shown in FIG. 13, a shared program circuit 84 outputting a program signal FA of 10 bits is provided instead of shared program circuit 14 shown in FIG. 2. This shared program circuit 84 is not divided into a portion for row programming and a portion for column programming. It has 10 fuse circuits of the kind as shown in FIGS. 4 and 5.

Figure 14:
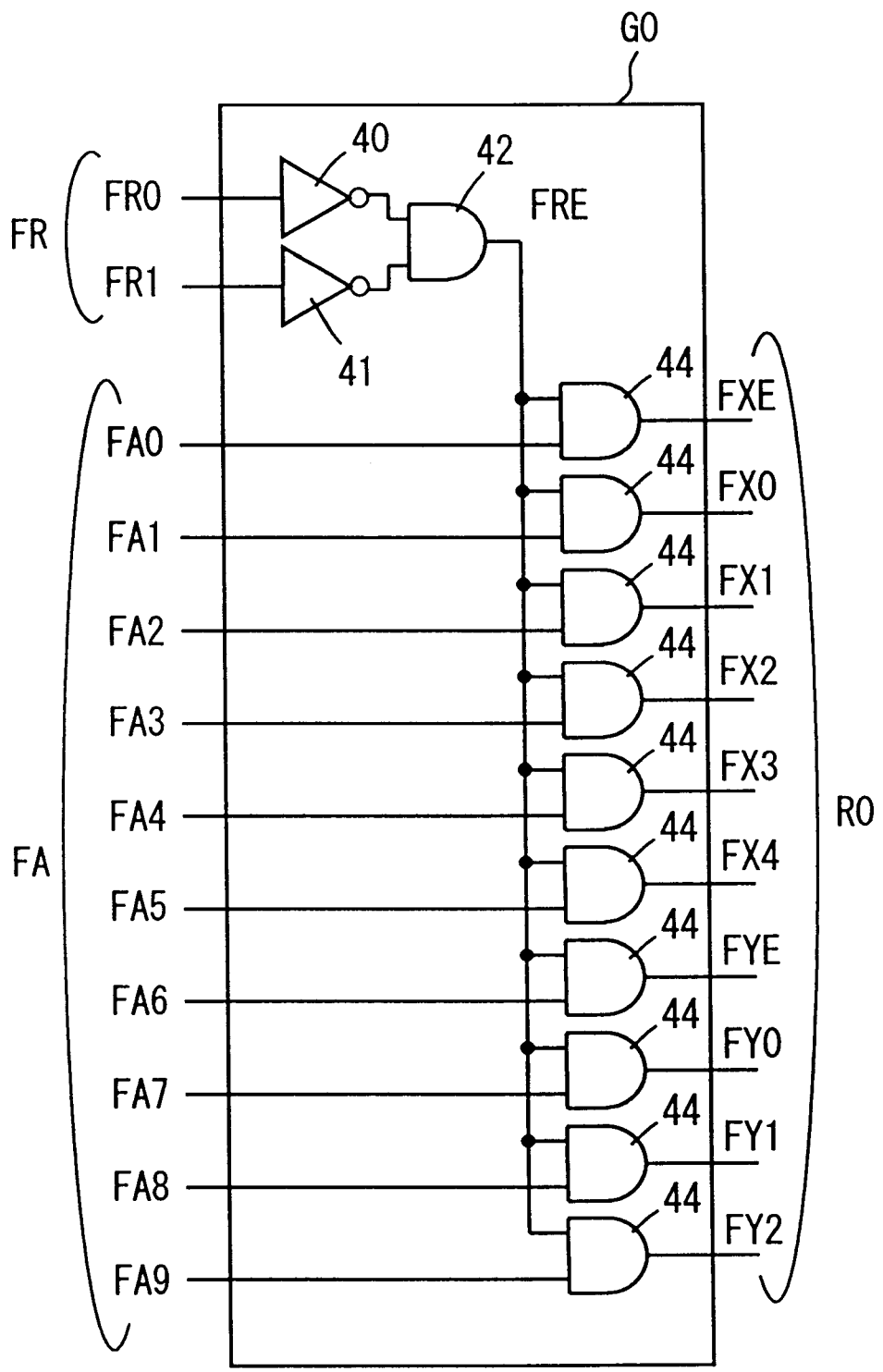
FIGS. 14–17 are circuit diagrams showing configurations of respective gate circuits G0–G3 shown in FIG. 13.

Gate circuit G0 shown in FIG. 13 includes ten AND circuits 44, as shown in FIG. 14. When gate select signals FR0 and FR1 are both at an L level, the ten AND circuits 44 respectively transmit program signals FA0–FA9 received from shared program circuit 84 as program signals FXE, FX0–FX4, FYE, FY0–FY2. More specifically, gate circuit G0 receives program signal FA of 10 bits (FA0–FA9), and outputs all of them as program signal R0 of 10 bits (FXE, FX0–FX4, FYE, FY0–FY2).

Figure 15:
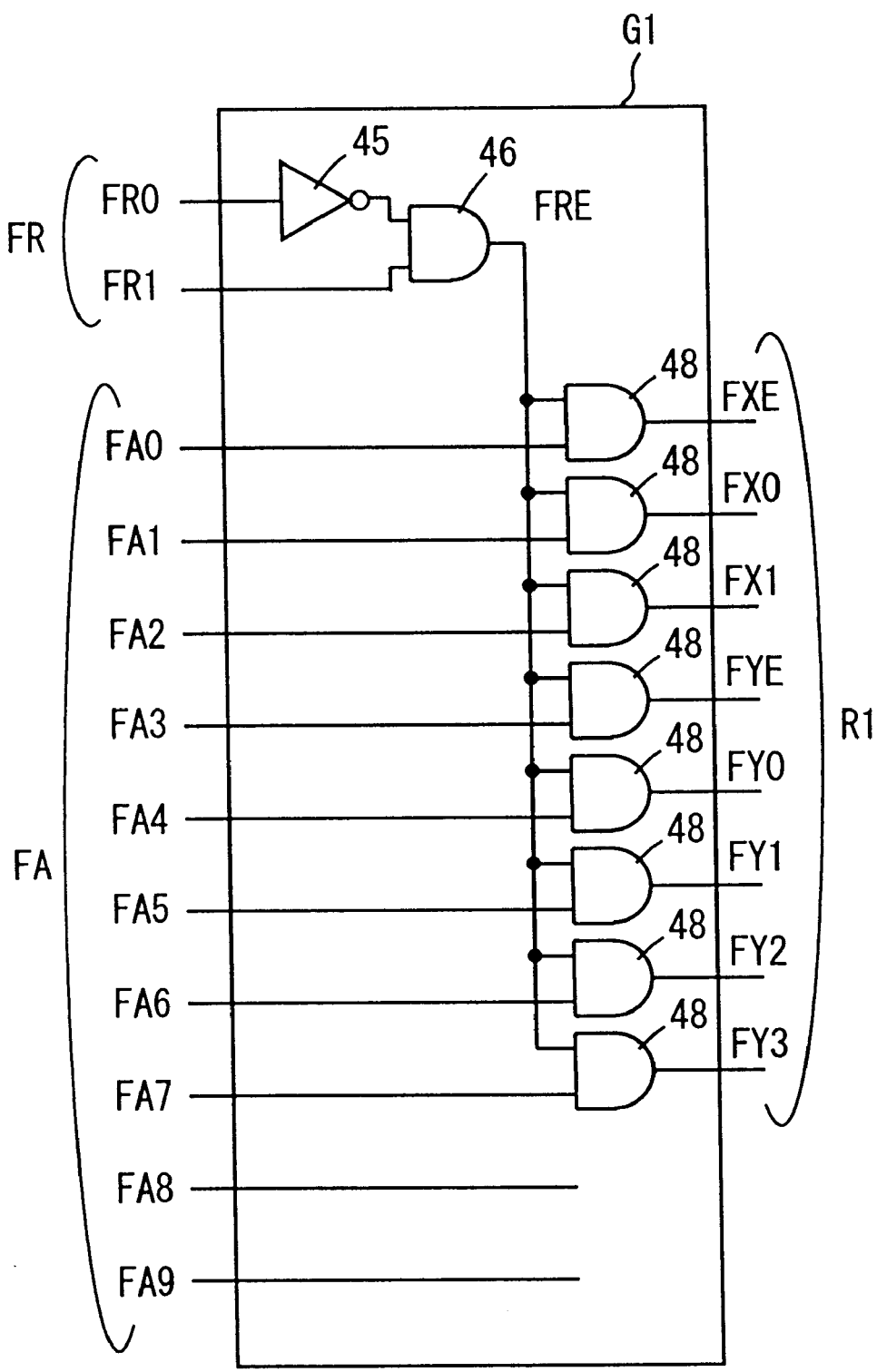

Gate circuit G1 shown in FIG. 13 includes eight AND circuits 48, as shown in FIG. 15. When gate select signal FR0 is at an L level and gate select signal FR1 is at an H level, the eight AND circuits 48 transmit program signals FA0–FA7 from shared program circuit 84 as program signals FXE, FX0, FX1, FYE, FY0–FY3. More specifically, gate circuit G1 receives program signal FA of 10 bits (FA0–FA9), and outputs 8 bits of the received 10 bits as program signal R1 of 8 bits (FXE, FX0, FX1, FYE, FY0–FY3).

Figure 16:
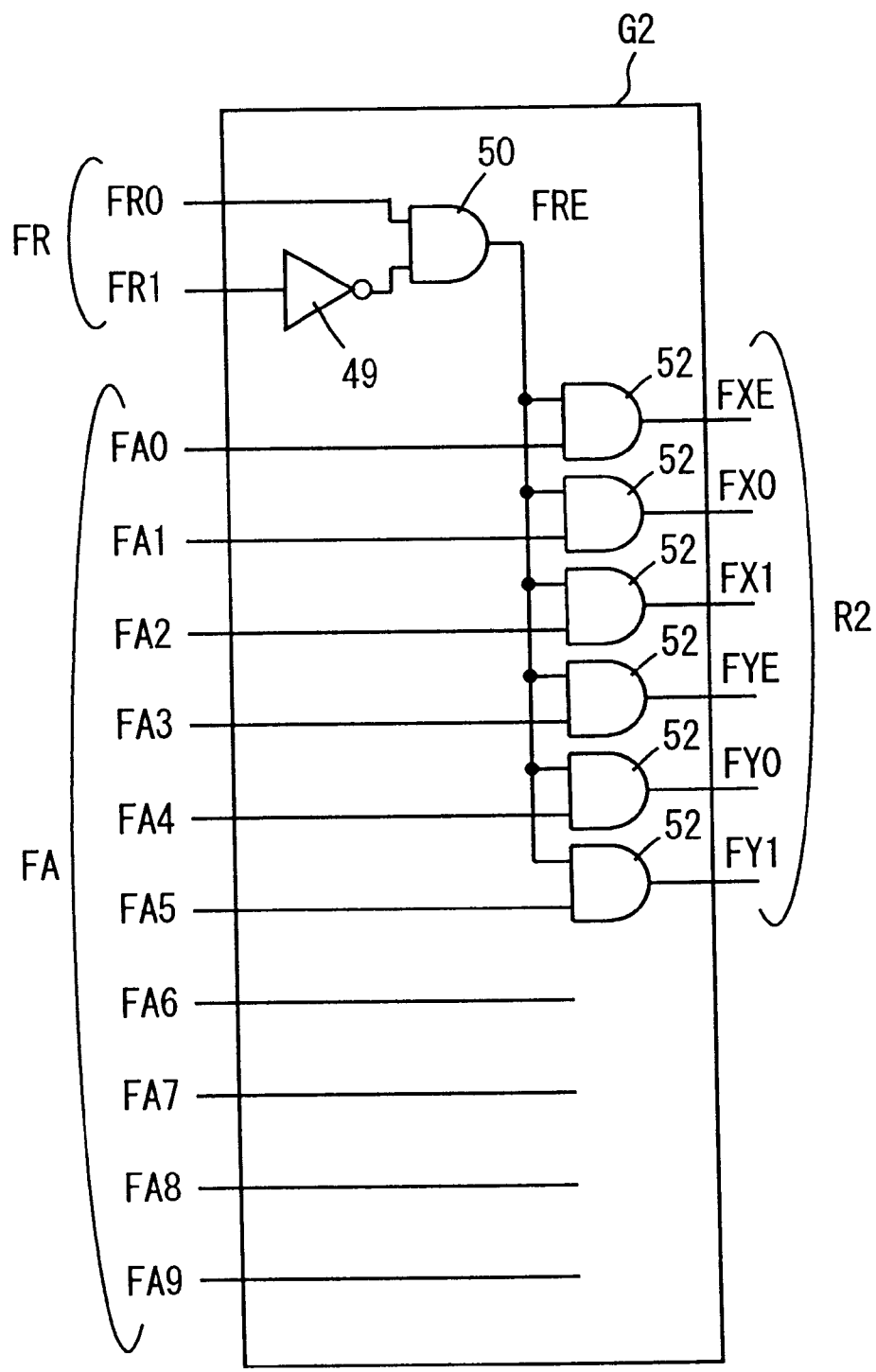

Gate circuit G2 shown in FIG. 13 includes six AND circuits 52, as shown in FIG. 16. When gate select signal FR0 is at an H level and gate select signal FR1 is at an L level, the six AND circuits 52 transmit program signals FA0–FA5 from shared program circuit 84 as program signals FXE, FX0, FX1, FYE, FY0, FY1. More specifically, gate circuit G2 receives program signal FA of 10 bits (FA0–FA9), and outputs 6 bits out of the 10 bits as program signal R2 of 6 bits (FXE, FX0, FX1, FYE, FY0, FY1).

Figure 17:
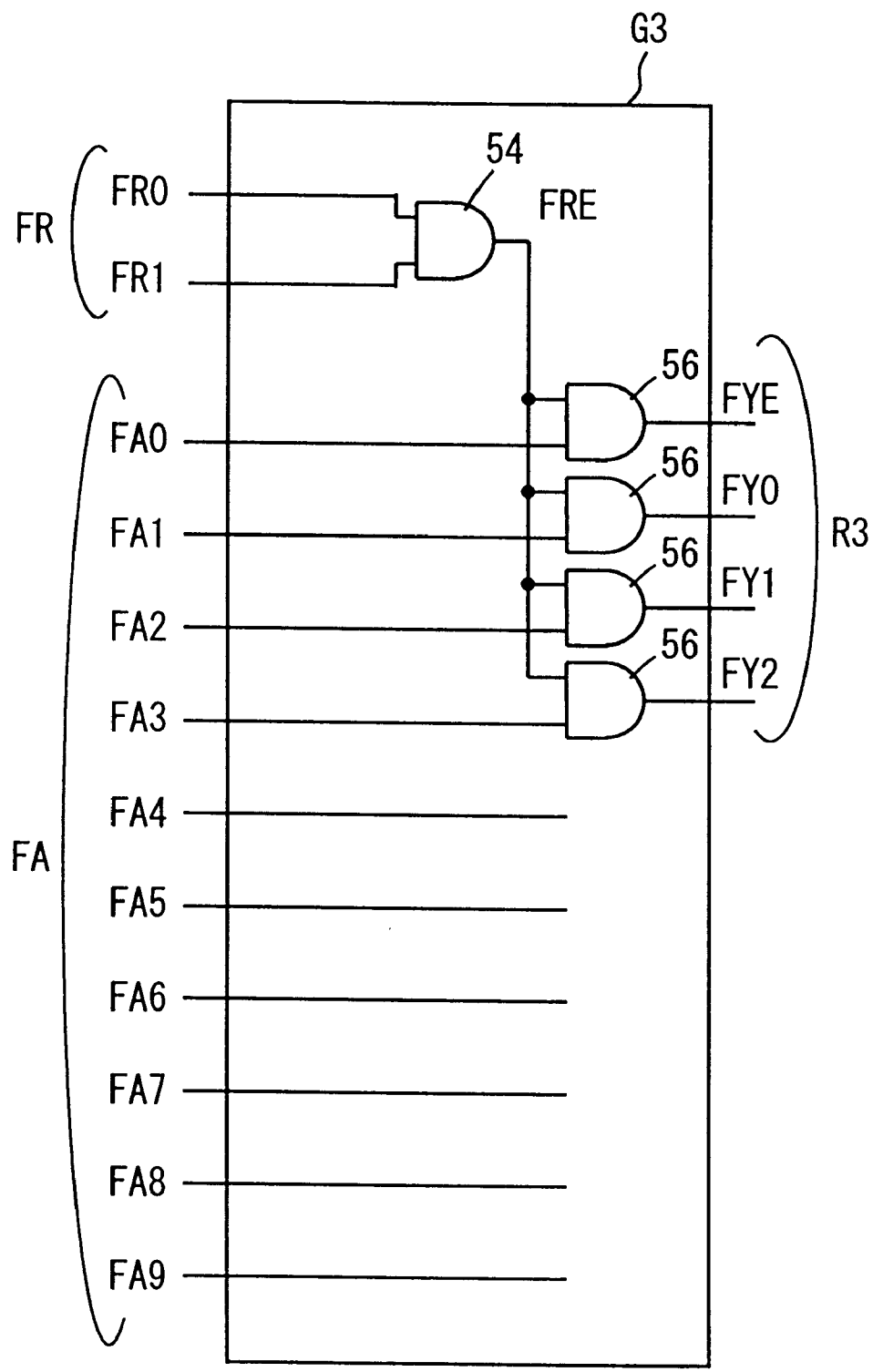

Gate circuit G3 shown in FIG. 13 includes four AND circuits 56, as shown in FIG. 17. When gate select signals FR0 and FR1 are both at an H level, the four AND circuits 56 transmit program signals FA0–FA3 from shared program circuit 84 as program signals FYE, FY0–FY2. More specifically, gate circuit G3 receives program signal FA of 10 bits, and outputs 4 bits thereof as program signal R3 of 4 bits (FYE, FY0–FY2).

In the above-described first embodiment, although gate circuits G0–G3 each receive the program signal of 11 bits FX, FY from shared program circuit 14, they each output the program signal of at most 10 bits. In other words, at least one bit of the program signal of 11 bits FX, FY output from shared program circuit 14 would be wasted. On the contrary, according to the second embodiment, gate circuit G0 receives program signal FA of 10 bits from shared program circuit 84 and outputs them as they are as program signal R0 of 10 bits, wasting no bits.

As explained above, according to the second embodiment, shared program circuit 84 is configured to output a program signal of a number of bits the same as a maximum number of bits of the program signal required for a plurality of memory circuits M0–M3. Therefore, it becomes possible to further reduce chip area occupied by shared program circuit 84 compared to the case of the first embodiment.

Third Embodiment

Figure 18:
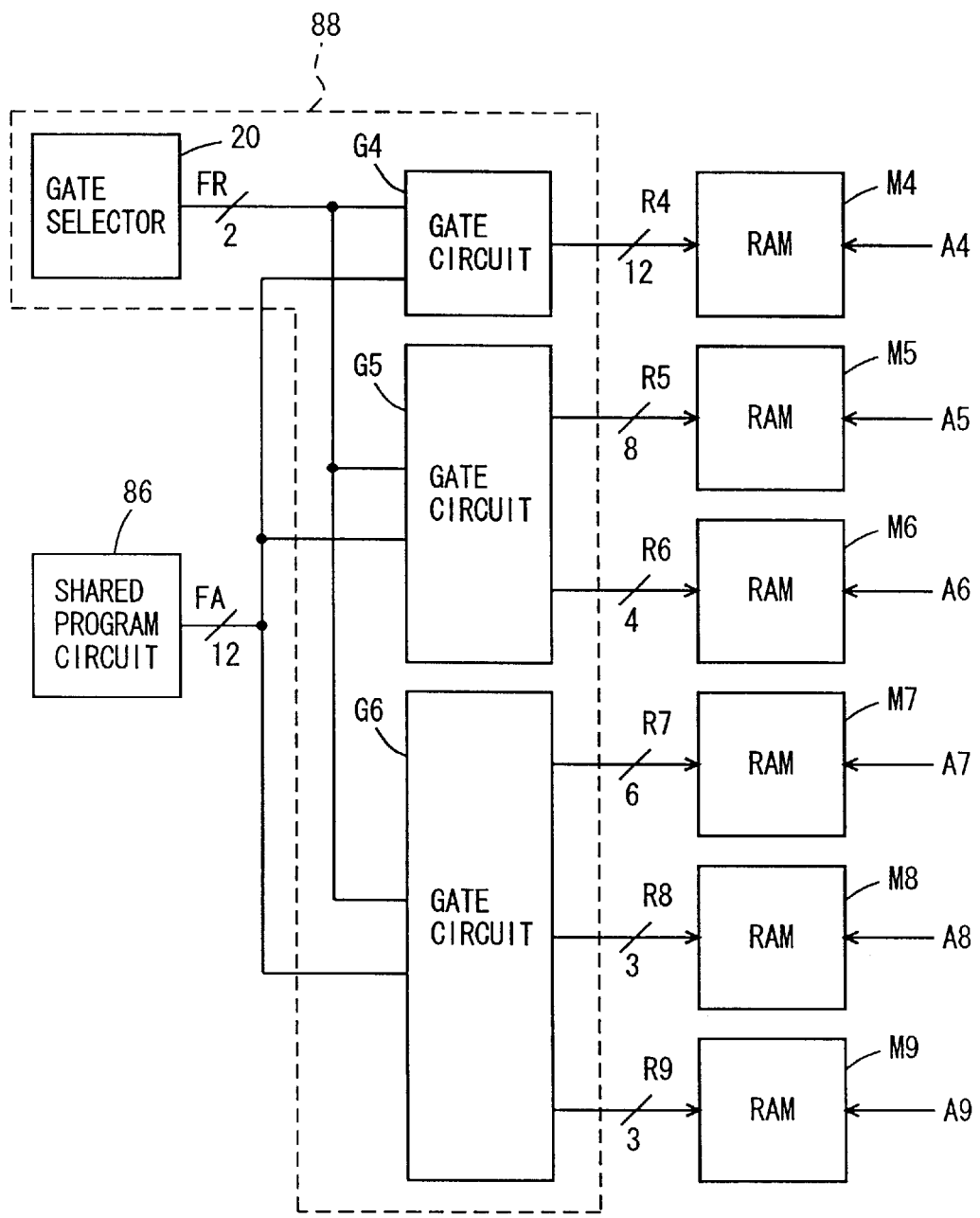
FIG. 18 is a block diagram showing a configuration of a primary portion of the semiconductor integrated circuit device according to a third embodiment of the present invention.

In the third embodiment, as shown in FIG. 18, a shared program circuit 86 outputs a program signal FA of 12 bits. This shared program circuit 86 includes 12 fuse circuits of the kind as shown in FIGS. 4 and 5.

Select circuit 88 includes gate circuits G4–G6. Gate circuit G4 is provided corresponding to memory circuit M4. Gate circuit G5 is provided corresponding to memory circuits M5 and M6. Gate circuit G6 is provided corresponding to memory circuits M7–M9.

Memory circuits M4–M9 respond to address signals A4–A9 different from one another, and perform data reading and writing. Memory circuits M4–M9 have configurations as follows:

M4: (8+2)×(8+1)

M5: (8+1)×(8+1)

M6: (8+1)×4

M7: (4+1)×(4+1)

M8: (4+1)×8

M9: 4×(4+1)

Specifically, memory circuit M4 has eight regular rows, two redundant rows, eight regular column and one redundant column. Thus, memory circuit M4 is provided with a program signal R4 of 12 bits. Memory circuit M5 has eight regular rows, one redundant row, eight regular columns and one redundant column. Thus, memory circuit M5 is provided with a program signal R5 of 8 bits. Memory circuit M6 has eight regular rows, one redundant row and four regular columns. Thus, memory circuit M6 is provided with a program signal R6 of 4 bits. Memory circuit M7 has four regular rows, one redundant row, four regular columns and one redundant column. Thus, memory circuit M7 is provided with a program signal R7 of 6 bits. Memory circuit M8 has four regular rows, one redundant row and eight regular columns. Thus, memory circuit M8 is provided with a program signal R8 of 3 bits. Memory circuit M9 has four regular rows, four regular columns and one redundant column. Thus, memory circuit M9 is provided with a program signal R9 of 3 bits.

Figure 19:
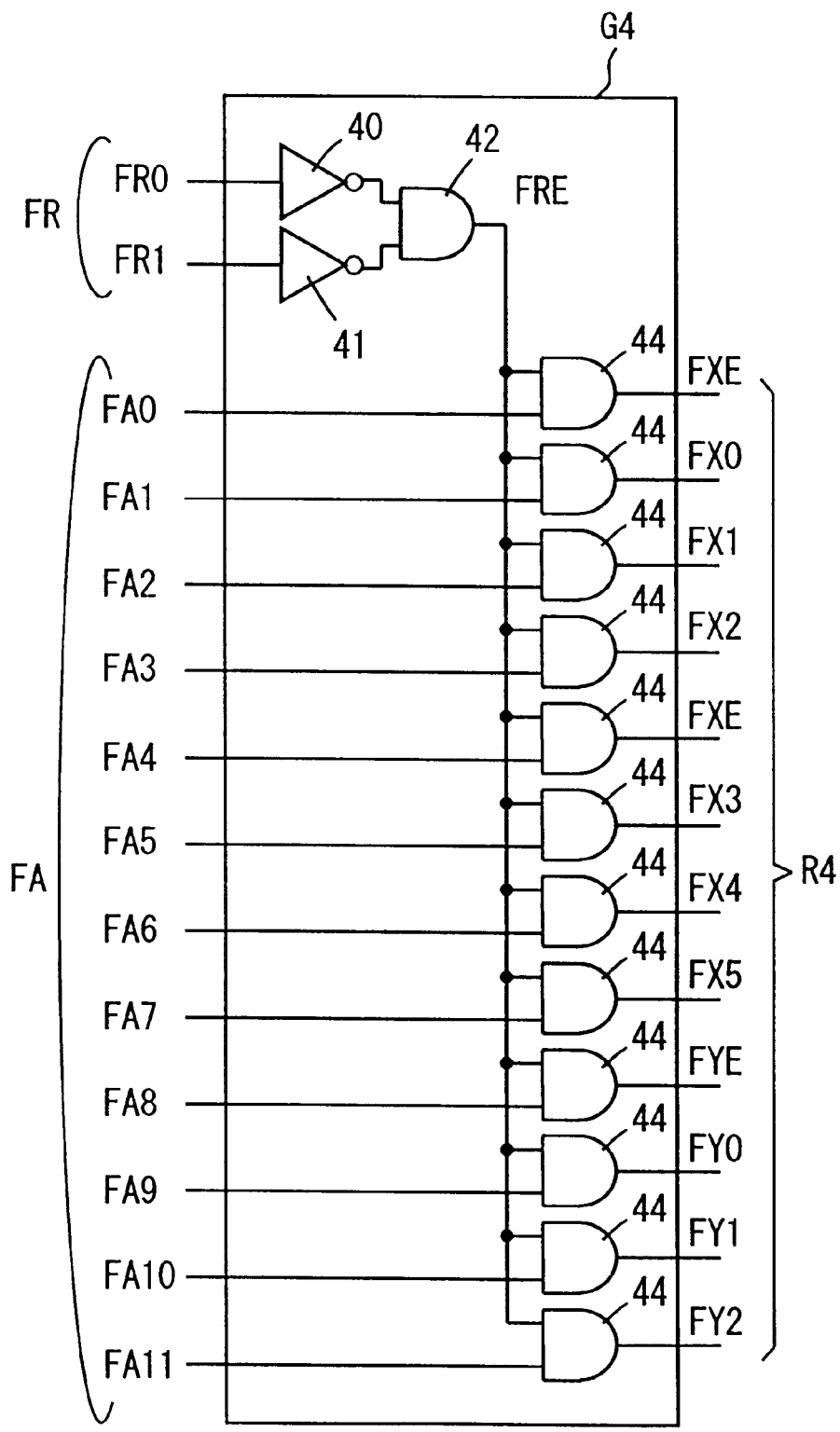
FIGS. 19–21 are circuit diagrams showing configurations of respective gate circuits G4–G6 shown in FIG. 18.

Gate selector 20 supplies gate select signal FR to gate circuits G4–G6 to activate one of gate circuits G4–G6. This means that select circuit 88 selects one memory circuit M4, or two memory circuits M5 and M6, or three memory circuits M7–M9. Referring to FIG. 19, gate circuit G4 includes 12 AND circuits 44. When gate select signals FR0 and FR1 are both at an L level, these 12 AND circuits 44 transmit program signals FA0–FA11 as program signals FXE, FX0–FX2, FXE, FX3–FX5, FYE, FY0–FY2, respectively. More specifically, gate circuit G4 receives program signal FA of 12 bits (FA0–FA11) from shared program circuit 86 and provides all of them as program signal R4 of 12 bits (FXE, FX0–FX2, FXE, FX3–FX5, FYE, FY0–FY2) to memory circuit M4.

Figure 20:
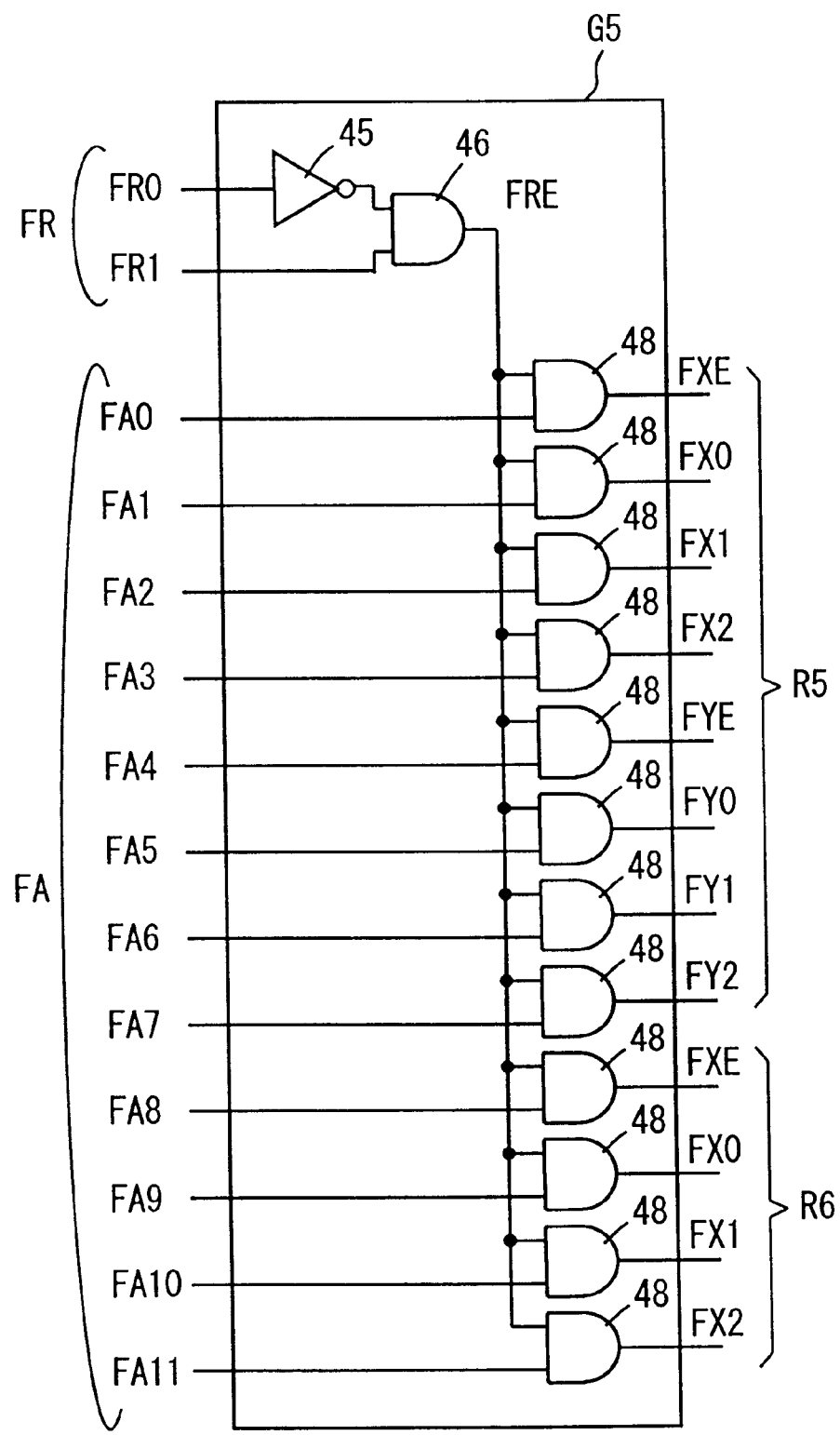

Gate circuit G5 includes 12 AND circuits 48, as shown in FIG. 20. When gate select signal FR0 is at an L level and gate select signal FR1 is at an H level, these 12 AND circuits 48 transmit program signals FA0–FA11 as program signals FXE, FX0–FX2, FYE, FY0–FY2, FXE, FX0–FX2. More specifically, gate circuit G5 receives program signal FA of 12 bits (FA0–FA11) from shared program circuit 86, and provides 8 bits of the received 12 bits as program signal R5 of 8 bits (FXE, FX0–FX2, FYE, FY0–FY2) to memory circuit M5 and the remaining 4 bits as program signal R6 of 4 bits (FXE, FX0–FX2) to memory circuit M6.

Figure 21:
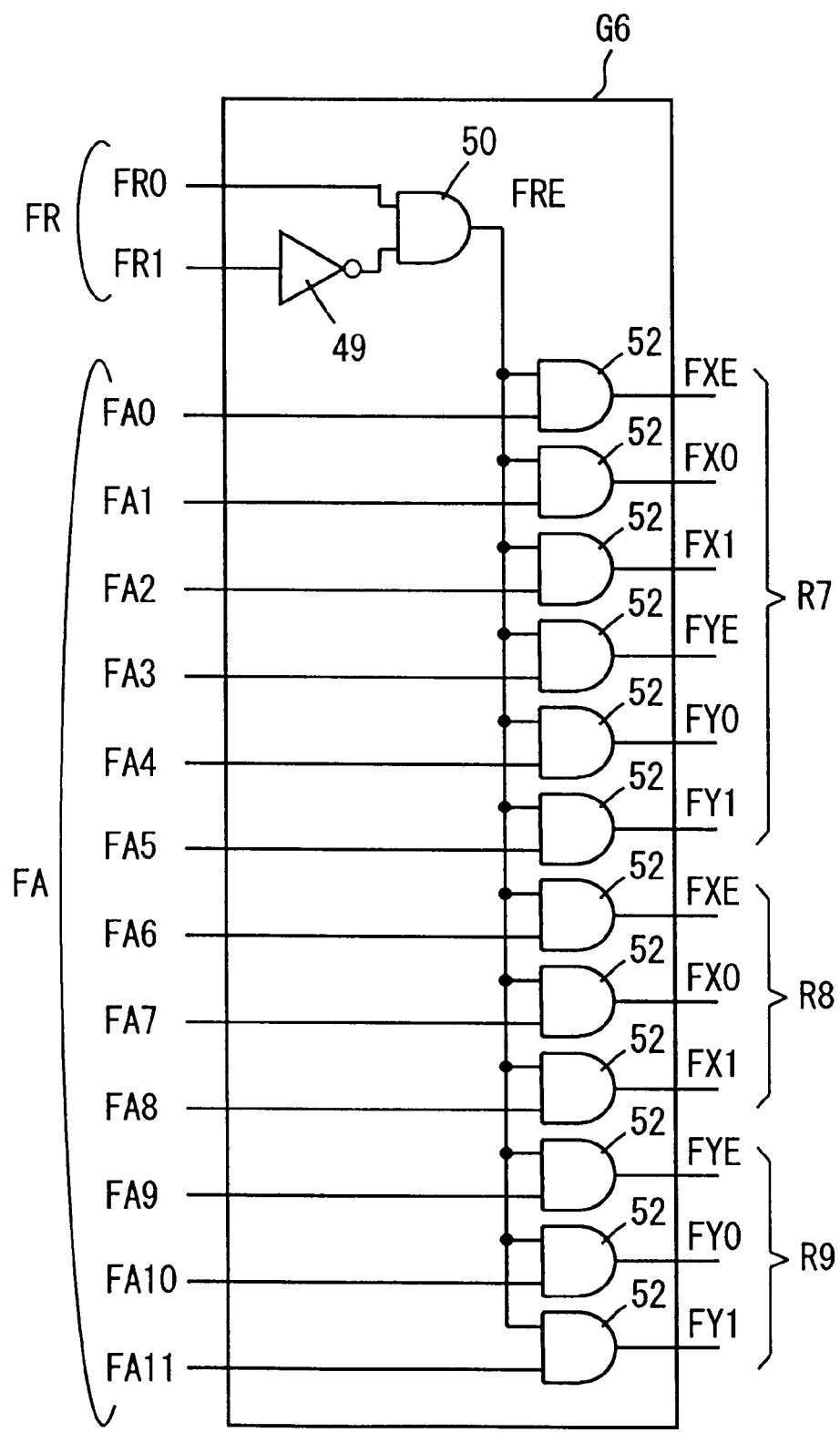

Gate circuit G6 includes 12 AND circuits 52, as shown in FIG. 21. When gate select signal FR0 is at an H level and gate select signal FR1 is at an L level, these 12 AND circuits 52 transmit program signals FA0–FA11 as program signals FXE, FX0, FX1, FYE, FY0, FY1, FXE, FX0, FX1, FYE, FY0, FY1. More specifically, gate circuit G6 receives program signal FA of 12 bits (FA0–FA11) from shared program circuit 86, and, of these 12 bits, provides 6 bits as program signal R7 of 6 bits (FXE, FX0, FX1, FYE, FY0, FY1) to memory circuit M7. Further, gate circuit G6 provides 3 bits out of the program signal FA of 12 bits as program signal R8 of 3 bits (FXE, FX0, FX1) to memory circuit M8. Still further, gate circuit G6 provides the remaining 3 bits of the program signal FA as program signal R9 of 3 bits (FYE, FY0, FY1) to memory circuit M9.

In the case of the first and second embodiments as described above, even if there exist defective memory cells both in memory circuits M2 and M3, only one of the memory circuits may be restored. On the contrary, according to the third embodiment, it is possible for select circuit 88 to select two memory circuits M5 and M6 at the same time, or select three memory circuits M7–M9 simultaneously. Thus, even if there exist defective memory cells in two memory circuits M5, M6, it is possible to restore both memory circuits M5 and M6. Further, even if there exist defective memory cells in three memory circuits M7–M9, these three memory circuits M7–M9 can be restored successfully.

As explained above, according to the third embodiment, select circuit 88 is configured to select two or more memory circuits. Therefore, it is possible to increase a relief rate of memory circuits M4–M9 without increasing chip area occupied by shared program circuit 86.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device, comprising:

a plurality of memory circuits receiving respective address signals and each having a regular memory cell and a redundant memory cell, said respective address signals being different from each other;

a select circuit selecting at least one of said plurality of memory circuits; and a shared program circuit provided for said plurality of memory circuits and allowing programming of an address of the regular memory cell to be replaced by the redundant memory cell in the memory circuit selected by said select circuit, wherein the plurality of memory circuits are of at least two different types in terms of a number of regular memory cells in each memory circuit.

2. The semiconductor integrated circuit device according to claim 1, wherein said shared program circuit includes a plurality of fuse circuits, the fuse circuits each including a fuse, and an element outputting a first level when said fuse is blown and outputting a second level when said fuse is not blown.

3. A semiconductor integrated circuit device, comprising:

a plurality of memory circuits receiving address signals different from each other and each having a regular memory cell and a redundant memory cell;

a select circuit selecting at least one of said plurality of memory circuits; and a shared program circuit provided for said plurality of memory circuits and allowing programming of an address of the regular memory cell to be replaced by the redundant memory cell in the memory circuit selected by said select circuit, wherein said select circuit includes a plurality of transmission circuits transmitting a program signal indicating the address programmed in said shared program circuit to said plurality of memory circuits, and an activation circuit selectively activating said plurality of transmission circuits.

4. The semiconductor integrated circuit device according to claim 3, wherein said plurality of transmission circuits are provided corresponding to said plurality of memory circuits.

5. The semiconductor integrated circuit device according to claim 4, wherein said shared program circuit outputs a program signal of a number of bits that is the same as a maximum number of bits of the program signal to be applied to said plurality of memory circuits.

6. The semiconductor integrated circuit device according to claim 3, wherein at least one of said transmission circuits is provided corresponding to at least two of said memory circuits.

7. The semiconductor integrated circuit device according to claim 6, wherein said transmission circuits each output the program signal of the same number of bits with each other.

8. A semiconductor integrated circuit device comprising:

a plurality of memory circuits receiving address signals different from each other and each having a regular memory cell and a redundant memory cell;

a select circuit selecting at least one of said plurality of memory circuits; and a shared program circuit provided for said plurality of memory circuits and allowing programming of an address of the regular memory cell to be replaced by the redundant memory cell in the memory circuit selected by said select circuit, wherein said shared program circuit includes a row program circuit allowing programming of the address of the regular memory cell to be replaced by the redundant memory cell arranged in a row in said memory circuit, and a column program circuit allowing programming of the address of the regular memory cell to be replaced by the redundant memory cell arranged in a column in said memory circuit.

\* \* \* \* \*